United States Patent
Okamoto et al.

(10) Patent No.: US 9,891,523 B2
(45) Date of Patent: Feb. 13, 2018

(54) PHOTOSENSITIVE DRY FILM AND PROCESS FOR PRODUCING PRINTED WIRING BOARD USING THE SAME

(71) Applicant: TAIYO INK MFG. CO., LTD., Hiki-gun (JP)

(72) Inventors: Daichi Okamoto, Hiki-gun (JP); Nobuhito Ito, Hiki-gun (JP); Shoji Minegishi, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 0 days.

(21) Appl. No.: 14/753,655

(22) Filed: Jun. 29, 2015

(65) Prior Publication Data
US 2015/0382473 A1    Dec. 31, 2015

(30) Foreign Application Priority Data

Jun. 30, 2014   (JP) .................. 2014-135225
Feb. 12, 2015   (JP) .................. 2015-025558

(51) Int. Cl.
*H05K 1/00*    (2006.01)
*G03F 7/11*    (2006.01)
(Continued)

(52) U.S. Cl.
CPC .............. *G03F 7/11* (2013.01); *G03F 7/0385* (2013.01); *G03F 7/0388* (2013.01); *G03F 7/09* (2013.01);
(Continued)

(58) Field of Classification Search
CPC ........ H05K 1/095; H05K 1/097; H05K 3/025; H05K 3/0073; H05K 3/108; H05K 3/244;
(Continued)

(56) References Cited

U.S. PATENT DOCUMENTS 5,110,705 A * 5/1992 Hosoya .................. G03G 13/08
                                                    399/285
5,557,060 A * 9/1996 Okada ................ G03G 15/0806
                                                    399/284
(Continued)

FOREIGN PATENT DOCUMENTS

JP    2004-359639    12/2004
JP    2005-97141    4/2005
(Continued)

OTHER PUBLICATIONS

Office Action dated Aug. 11, 2015 in Japanese Patent Application No. 2015-025558 (with English language translation).
(Continued)

*Primary Examiner* — Xiaoliang Chen
(74) *Attorney, Agent, or Firm* — Oblon, McClelland, Maier & Neustadt, L.L.P.

(57) ABSTRACT

Provided is a photosensitive dry film capable of forming a solder resist layer that has an excellent filling property of underfill and that exhibits an excellent adhesion with a mold material. The photosensitive dry film according to the present invention is a photosensitive dry film including a supporting film and a photosensitive resin layer provided on one side of the supporting film, wherein the arithmetic average surface roughness Ra of the side of the supporting film on which the photosensitive resin layer is provided is 50 to 390 nm.

18 Claims, 2 Drawing Sheets

(51) Int. Cl.
G03F 7/038 (2006.01)
G03F 7/09 (2006.01)
H05K 3/28 (2006.01)
H05K 3/34 (2006.01)

(52) U.S. Cl.
CPC .......... *H05K 3/287* (2013.01); *H05K 3/281* (2013.01); *H05K 3/3452* (2013.01); *H05K 2201/0129* (2013.01)

(58) Field of Classification Search
CPC .......... G03F 7/09; G03G 15/08; G03G 15/20; G03G 15/0818; H01L 21/50; H01L 21/283; H01L 21/683
USPC .......... 174/250; 156/247; 257/40, 299, 773; 428/141, 149, 220, 209, 323; 430/123.58, 430/272.1; 399/31, 115, 284, 285, 333
See application file for complete search history.

(56) References Cited

U.S. PATENT DOCUMENTS

| | | | |
|---|---|---|---|
| 5,879,854 A * | 3/1999 | Tomita | G03F 7/09 428/149 |
| 6,312,792 B1 * | 11/2001 | Okada | C08G 18/10 252/500 |
| 6,420,012 B1 * | 7/2002 | Takagi | G03G 15/0818 399/31 |
| 6,824,858 B2 | 11/2004 | Iwaida et al. | |
| 7,286,294 B2 * | 10/2007 | Quenzer | G02B 27/0938 359/359 |
| 7,714,233 B2 | 5/2010 | Kawamura et al. | |
| 7,759,043 B2 | 7/2010 | Tanabe et al. | |
| 2003/0129535 A1 * | 7/2003 | Tzou | G03F 7/038 430/280.1 |
| 2003/0150109 A1 * | 8/2003 | Magoi | H05K 3/38 29/846 |
| 2003/0232185 A1 * | 12/2003 | Shimamura | G03G 15/0818 428/323 |
| 2004/0014413 A1 * | 1/2004 | Kawahashi | B24B 37/26 451/527 |
| 2005/0028728 A1 * | 2/2005 | Liu | C30B 29/04 117/86 |
| 2005/0047839 A1 * | 3/2005 | Shimizu | G03G 15/2057 399/333 |
| 2006/0011961 A1 * | 1/2006 | Taki | H01G 7/06 257/299 |
| 2006/0113669 A1 * | 6/2006 | Ookawa | H05K 3/22 257/752 |
| 2006/0131561 A1 * | 6/2006 | Hirai | C23C 16/30 257/40 |
| 2007/0191812 A1 | 8/2007 | Nishide et al. | |
| 2007/0218305 A1 * | 9/2007 | Ishigaki | G03F 7/027 428/500 |
| 2009/0040601 A1 | 2/2009 | Saito et al. | |
| 2009/0136725 A1 * | 5/2009 | Shimokawa | H05K 3/108 428/209 |
| 2009/0280432 A1 * | 11/2009 | Hayashi | B32B 27/06 430/270.1 |
| 2009/0284128 A1 * | 11/2009 | Shinohara | H01L 27/3211 313/498 |
| 2010/0189941 A1 * | 7/2010 | Funakoshi | B41C 1/05 428/35.8 |
| 2011/0240482 A1 * | 10/2011 | Satou | C23C 18/1608 205/164 |
| 2012/0015288 A1 * | 1/2012 | Ikeda | G03F 1/68 430/5 |
| 2012/0021563 A1 * | 1/2012 | Koyanagi | H01L 21/6835 438/107 |
| 2012/0055697 A1 * | 3/2012 | Okamoto | G11B 5/4833 174/250 |
| 2012/0301824 A1 * | 11/2012 | Yoshida | G03F 7/0047 430/270.1 |
| 2012/0301825 A1 * | 11/2012 | Yoshida | G03F 7/0047 430/270.1 |
| 2013/0056876 A1 * | 3/2013 | Harvey | H01L 51/003 257/773 |
| 2014/0251656 A1 * | 9/2014 | Ikeda | H05K 3/4676 174/251 |
| 2014/0349025 A1 * | 11/2014 | Hui | H05K 1/095 427/492 |
| 2014/0374143 A1 * | 12/2014 | Okamoto | G03F 7/095 174/250 |
| 2015/0079505 A1 * | 3/2015 | Kato | H05K 3/287 430/18 |
| 2015/0086301 A1 * | 3/2015 | Rogers | H01L 21/6838 414/217 |
| 2015/0102707 A1 * | 4/2015 | Hori | H03H 9/25 310/348 |
| 2015/0158268 A1 * | 6/2015 | Koike | B32B 3/30 156/247 |
| 2015/0191588 A1 * | 7/2015 | Choi | C08K 3/04 428/220 |
| 2015/0240071 A1 * | 8/2015 | Okamoto | H05K 3/287 428/195.1 |

FOREIGN PATENT DOCUMENTS

| | | |
|---|---|---|
| JP | 2005-220097 | 8/2005 |
| JP | 2006-160634 | 6/2006 |
| JP | 2007-178500 | 7/2007 |
| JP | 2008-94770 | 4/2008 |
| JP | 2008-509967 | 4/2008 |
| JP | 2008-166313 A | 7/2008 |
| JP | 2008-250246 A | 10/2008 |
| JP | 2009-40762 | 2/2009 |
| JP | 2009-223142 | 10/2009 |
| JP | 2010-072340 A | 4/2010 |
| JP | 2010-085513 A | 4/2010 |
| JP | 2011-80036 | 4/2011 |
| JP | 2012-93559 A | 5/2012 |
| JP | 2012-141605 | 7/2012 |
| JP | 2012-215716 A | 11/2012 |
| JP | 2014-074927 A | 4/2014 |
| JP | 2014-081612 A | 5/2014 |
| WO | WO 01/58977 A1 | 8/2001 |
| WO | WO 2005/044359 A1 | 5/2005 |
| WO | WO 2006/059534 A1 | 6/2006 |
| WO | WO 2006/123712 A1 | 11/2006 |
| WO | WO 2007/004657 A1 | 1/2007 |
| WO | WO 2012/090532 A1 | 7/2012 |
| WO | WO 2015/163455 A1 | 10/2015 |

OTHER PUBLICATIONS

Office Action dated Sep. 9, 2016 in Japanese Patent Application No. 2015-221229 (with unedited computer generated English translation).

Japanese Office Action dated Jul. 25, 2017, in Japanese Patent Application No. 2017-130660 (with English Translation).

Japanese Office Action dated Jul. 25, 2017, in Japanese Patent Application No. 2017-130666 (with English Translation).

Office Action dated Mar. 10, 2017 in Japanese Patent Application No. 2015-221229 (with unedited computer generated English translation).

\* cited by examiner (A)

(B)

(C)

(D)

PHOTOSENSITIVE DRY FILM AND PROCESS FOR PRODUCING PRINTED WIRING BOARD USING THE SAME

CROSS-REFERENCE TO RELATED APPLICATIONS

This application is based upon and claims the benefit of priority from prior Japanese patent applications, Japanese Patent Application No. 2014-135225 (filing date: Jun. 30, 2014) and Japanese Patent Application No. 2015-025558 (filing date: Feb. 12, 2015), which are incorporated herein by reference in its entirety.

BACKGROUND OF THE INVENTION

Field of the Invention

The present invention relates to a photosensitive dry film that includes a curable resin layer on which pattern formation is feasible by exposure and development; and more particularly, related to a photosensitive dry film that can be suitably used for formation of a solder resist layer in particular for an IC package such as a solder resist of printed wiring board.

Background Art

In printed wiring boards used for electronic apparatuses, when electronic components are mounted on the printed wiring board, a solder resist layer is in general formed in an area other than connection holes on the board on which a circuit pattern is formed for the purpose of preventing soldering from adhering to unnecessary components and, at the same time, preventing a circuit conductor from being exposed to be corroded by oxidation or humidity.

Recently, printed wiring boards become more precise and denser due to miniaturization of electronic apparatuses. Associated with this, it is currently mainstream that a solder resist layer is formed by a so-called photosensitive solder resist, wherein a photosensitive resin ink is applied onto a base material; pattern formation is carried out by exposure and development; and then a resin after the pattern formation was is subjected to final curing by heating or light irradiation.

In addition, what has been also proposed is the use of a so-called photosensitive dry film, wherein the solder resist layer is formed without using the above liquid photosensitive resin ink, which allows a dry step following the ink application not to be required. Such a photosensitive dry film is in general composed of a laminate film stack in which a photosensitive resin layer is provided on a supporting film and a protective film is laminated on the photosensitive resin layer. When the film is used, a protective film is peeled and placed to a wiring board by thermocompression bonding. The resultant is subjected to exposure from above the supporting film; and thereafter the supporting film is peeled and subjected to development, thereafter forming a solder resist layer on which the pattern is formed. When compared with the case where the wet coating described above is employed for the film formation, the step of drying an ink can be omitted in cases where the solder resist layer is formed using the photosensitive dry film. On the top of that, because the dry film is thermocompressively bound to the circuit board, air bubbles are hard to be held between the board and the solder resist film and an improvement of filling up dents of the board surface is seen. In addition, because the exposure is carried out in a state where the solder resist layer is covered by the supporting film, the influence of oxygen to inhibit the curing is smaller; and the obtained solder resist layer exhibits a higher surface smoothness and a higher surface hardness, as compared with the case of the wet coating.

Meanwhile, it has been known that, by subjecting a solder resist layer to surface roughening, the solder adhesion resistance at the time of flow soldering improves; and thus a filler such as silica or talc has been conventionally added in a photosensitive resin composition. In addition, use of a photosensitive ink capable of forming a solder resist layer with low gloss without adding the filler has been proposed, which photosensitive ink is prepared by adding a specific photosensitive prepolymer in a photosensitive resin (for example, WO 2001/058977 and the like).

Further, Japanese Patent Application Laid-Open Publication No. 2012-141605 teaches that, by subjecting the surface of solder resist layer to surface roughening, wiring concealment improves and the gloss is kept lower, thereby obtaining good design properties. There is mentioned that, in cases where a solder resist layer is formed using a photosensitive dry film, the surface of the solder resist layer can be roughened by adjusting the surface roughness Ra of a supporting film to a range of 0.2 to 3 μm.

SUMMARY OF THE INVENTION

The present inventors this time noticed that, when compared with cases where solder resist layer is formed by wet coating, in cases where a solder resist layer is formed using a photosensitive dry film, the filling property of underfill deteriorated in the step of filling the underfill following the mounting of IC chips, in particular when applied to a board for an IC package; and found out this was caused by a high surface smoothness of the solder resist layer. The present inventors then obtained findings that, by using a film with particular surface roughness as the supporting film of the photosensitive dry film, moderate roughness morphology could be imparted to the surface of the solder resist layer after detachment of the supporting film and, as a result, a solder resist layer with an excellent filling property of underfill and an excellent adhesion with a mold material could be formed. The present invention is based on such findings.

That is, an object of the present invention is to provide a photosensitive dry film capable of forming a solder resist layer with an excellent filling property of underfill and an excellent adhesion with a mold material. In addition, another object of the present invention is to provide a method of producing a printed wiring board using the photosensitive dry film.

The photosensitive dry film according to the present invention is a photosensitive dry film comprising a supporting film and a photosensitive resin layer provided on one side of the above-mentioned supporting film, characterized in that the arithmetic average surface roughness Ra of the side of the above-mentioned supporting film on which the photosensitive resin layer is provided is 50 to 390 nm.

In accordance with an aspect of the present invention, the photosensitive dry film may further comprise a protective film on the side of the above-mentioned photosensitive resin layer opposed to the above-mentioned supporting film.

In accordance with an aspect of the present invention, adhesion between the above-mentioned protective film and the above-mentioned photosensitive resin layer may be smaller than adhesion between the above-mentioned supporting film and the above-mentioned photosensitive resin layer.

In accordance with an aspect of the present invention, the thickness of the above-mentioned photosensitive resin layer may be 5 to 150 μm.

In accordance with an aspect of the present invention, the above-mentioned supporting film may comprise a resin composition containing a thermoplastic resin and a filler.

Further, a printed wiring board according to another aspect of the present invention is a printed wiring board produced using the above photosensitive dry film, wherein the arithmetic average surface roughness Ra of the cured coating film surface formed by exposure and development of the above-mentioned photosensitive resin layer is 50 to 390 nm.

According to the present invention, the use of the supporting film whose side provided on the photosensitive resin layer has an arithmetic average surface roughness Ra of 50 to 390 nm enables a photosensitive dry film to be produced in practice, which photosensitive dry film is capable of forming a solder resist layer with an excellent filling property of underfill and an excellent adhesion with a mold material.

DETAILED DESCRIPTION OF THE INVENTION

<Photosensitive Dry Film>

Figure 1:
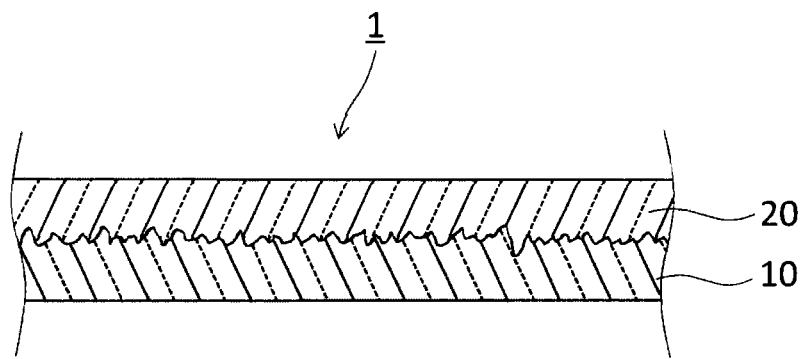
FIG. 1 is a schematic cross sectional view showing one embodiment of the photosensitive dry film according to the present invention.
Figure 2:
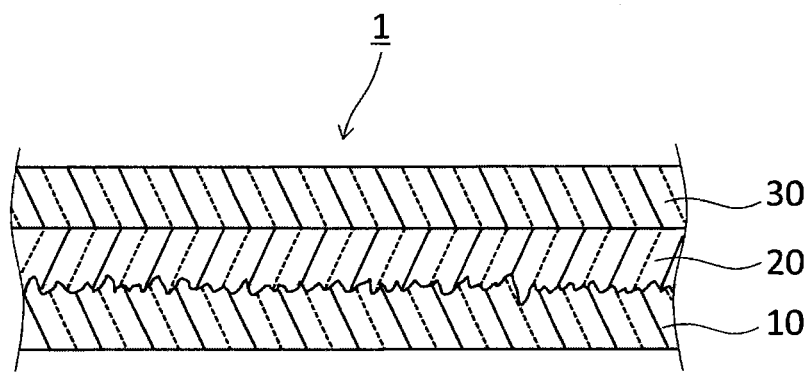
FIG. 2 is a schematic cross sectional view showing another embodiment of the photosensitive dry film according to the present invention.

The photosensitive dry film according to the present invention will be described below with reference to the drawings. FIG. 1 and FIG. 2 are schematic cross sectional views showing one embodiment of the photosensitive dry film according to the present invention. As shown in FIG. 1, the photosensitive dry film 1 include the supporting film 10 and the photosensitive resin layer 20 provided on the side opposed to the supporting film. In addition, in the present invention, for the purpose of preventing dust and the like from adhering to the surface of the photosensitive resin layer 20 and with consideration for ease of handling of the photosensitive dry film, the protective film 30 may further be provided on the side of the photosensitive resin layer 20 opposed to the supporting film 10 as shown in FIG. 2. Each of the components that compose the photosensitive dry film according to the present invention will be described below.

[Supporting Film]

A supporting film has roles of supporting a photosensitive resin layer described later and of concurrently incorporating a prescribed surface morphology to the side of the photosensitive resin layer that contact with the supporting film at the time of exposure and development of the photosensitive resin layer, as described later. In accordance with the present invention, a supporting film whose side provided on the photosensitive resin layer has an arithmetic average surface roughness Ra of 50 to 390 nm is used. By using the supporting film having the surface morphology just described above, while the resolution at the time of exposure and development of the photosensitive dry film is kept high, the filling property when underfill is filled to the surface of a cured coating film (solder resist layer) obtained by using the photosensitive dry film can be improved; and the adhesion of the cured coating film with the mold material can be concurrently improved as well. That is, the prescribed surface morphology of the supporting film is incorporated to the surface of the cured coating film; and thereby the filling property of the underfill and the adhesion with the mold material are improved. It is to be noted that the arithmetic average surface roughness Ra means a value measured in accordance with JIS B0601.

By making the arithmetic average surface roughness Ra of the supporting film provided on the photosensitive resin layer 50 nm or more, the filling property of underfill and the adhesion with the mold material are improved. In addition, by making the arithmetic average surface roughness Ra 390 nm or less, good resolution is attained. The preferred range of the arithmetic average surface roughness Ra is 100 to 300 nm.

As the supporting film, any can be used with no limitation as long as it has the surface morphology described above and is capable of transmitting light at the time of exposure. For example, films composed of thermoplastic resins such as polyester films such as polyethylene terephthalate or polyethylene naphthalate, polyimide films, polyamide-imide films, polypropylene films, or polystyrene films can be suitably used. Of these, polyester films can be suitably used from the viewpoint of thermal resistance, mechanical strength, ease of handling, and the like.

In addition, for the purpose of improving the strength, Films stretched in a uniaxial direction or a biaxial direction are preferably used as the thermoplastic resin film described above.

In cases where the thermoplastic resin film is used as the supporting film having the arithmetic average surface roughness Ra described above, the surface can have a prescribed morphology by adding a filler in a resin at the time of film formation, subjecting to the film surface to blasting, or hairline processing, matt coating, chemical etching or the like. A thermoplastic resin film having the arithmetic average surface roughness Ra described above can be obtained. For example, in cases where a filler is added to a resin, the arithmetic average surface roughness Ra can be controlled by adjusting the particle size of the filler and the amount of the filler added. Further, in the case of blasting, the arithmetic average surface roughness Ra can be controlled by adjusting processing conditions such as a blast material, blasting pressure, or the like. As the thermoplastic resin film having surface roughness just described above, commercially available one may be used; and examples thereof include Lumirror X42, Lumirror X43, and Lumirror X44 manufactured by Toray Industries, Inc. and Emblet PTH-12, Emblet PTH-25, Emblet PTHA-25, Emblet PTH-38 manufactured by Unitika Limited.

In the present invention, it is preferred to use a thermoplastic resin film obtained by depositing a resin composition containing a thermoplastic resin and a filler. This is because, if a thermoplastic resin film subjected to blasting is used, a blast material remaining on the film surface may in some cases transfer to a photosensitive resin layer, thereby decreasing the quality of a cured coating film. In addition, the blast material may in some cases scatter from the thermoplastic resin film subjected to the blasting. Therefore, in cases where the photosensitive dry film is required to be used inside a clean room, the use of the thermoplastic resin film subjected the blasting is not preferred.

An anti-sticking treatment may be performed on the side of the supporting film provided with the photosensitive resin layer. For example, a coating liquid prepared by dissolving or dispersing an anti-sticking agent such as a wax, a silicone wax, a silicone-based resin into an appropriate solvent can be applied on and dried the surface of the supporting film by a coating method such as a roll coating method, a spray coating method or a known means such as a gravure printing method or a screen printing method, thereby performing the anti-sticking treatment.

The thickness of the supporting film is not in particular restricted; and can be selected as appropriate in a range of approximately 10 to 150 μm according to the application.

[Photosensitive Resin Layer]

A photosensitive resin layer provided on the side of the supporting film having the predetermined surface roughness described above is subjected to patterning by exposure and development of the photosensitive dry film to be a cured coating film (solder resist layer) provided on the circuit board. As such a photosensitive resin layer, a conventionally known solder resist ink can be used without limitation. An example of the photosensitive resin compositions that can be preferably used as the photosensitive resin layer of the photosensitive dry film according to the present invention will be described below.

In the present invention, the photosensitive resin composition contains a carboxyl group-containing photosensitive resin, a photoinitiator, and a thermosetting component. Each of the components will be described below.

The carboxyl group-containing photosensitive resin is a component that is cured through polymerization or cross-linking by light irradiation and contains a carboxyl group, which allows it to have alkaline development properties. In addition, from the viewpoint of photocurability and development resistance, it is preferred to have, in addition to the carboxyl group, an ethylenically unsaturated bond in the molecule; but a carboxyl group-containing photosensitive resin that does not have the ethylenically unsaturated double bond may be used solely. In cases where the carboxyl group-containing photosensitive resin does not have the ethylenically unsaturated bond, it is required to be used in conjunction with a compound having one or more ethylenically unsaturated groups in the molecule (photopolymerizable monomer) for the purpose of making the composition photocurable. As the ethylenically unsaturated double bond, preferred is one derived from acrylic acid or methacrylic acid or a derivative thereof.

Further, it is preferred to use, as the carboxyl group-containing photosensitive resin, a carboxyl group-containing photosensitive resin that does not use an epoxy resin as a starting raw material. The carboxyl group-containing photosensitive resin that does not use an epoxy resin as a starting raw material has a very low content of halide ions, which can inhibit deterioration of insulation reliability. Specific examples of the carboxyl group-containing photosensitive resin include compounds listed below (may be either oligomers or polymers).

(1) A carboxyl group-containing photosensitive resin obtained by bringing a bifunctional (solid) epoxy resin or a (solid) epoxy resin with three or more functionalities, which is described later, into reaction with (meth)acrylic acid and adding a dibasic acid anhydride such as phthalic anhydride, tetrahydrophthalic anhydride, or hexahydrophthalic anhydride to the hydroxyl group present in a side chain.

(2) A carboxyl group-containing photosensitive resin obtained by bringing a multifunctional epoxy resin into reaction with (meth)acrylic acid and adding a dibasic acid anhydride to the generated hydroxyl group, which multifunctional epoxy resin is obtained by epoxidation of a hydroxyl group of bifunctional (solid) epoxy resin with epichlorohydrin, as described later.

(3) A carboxyl group-containing photosensitive resin obtained by bringing an epoxy compound having two or more epoxy groups in one molecule into reaction with a compound having at least one alcoholic hydroxyl group and one phenolic hydroxyl group in one molecule and an unsaturated group-containing monocarboxylic acid such as (meth)acrylic acid, and bringing the alcoholic hydroxyl group of the obtained reaction product into reaction with a polybasic anhydride such as maleic anhydride, tetrahydrophthalic anhydride, trimellitic anhydride, pyromellitic anhydride, or adipic acid.

(4) A carboxyl group-containing photosensitive resin obtained by bringing a compound having two or more phenolic hydroxyl groups in one molecule such as bisphenol A, bisphenol F, bisphenol S, novolak-type phenol resin, poly-p-hydroxy styrene, a condensate of naphthol and aldehydes, or a condensate of dihydroxy naphthalene and aldehydes into reaction with an alkylene oxide such as ethylene oxide or propylene oxide; bringing the obtained reaction product into reaction with a unsaturated group-containing monocarboxylic acid such as (meth)acrylic acid; and bringing the obtained reaction product into reaction with a polybasic anhydride.

(5) A carboxyl group-containing photosensitive resin obtained by bringing a compound having two or more phenolic hydroxyl groups in one molecule into reaction with a cyclic carbonate compound such as ethylene carbonate or propylene carbonate; bringing the obtained reaction product into reaction with an unsaturated group-containing monocarboxylic acid; and bringing the obtained reaction product into reaction with a polybasic anhydride.

(6) A terminal carboxyl group-containing urethane resin obtained by bringing the end of urethane resin obtained by a polyaddition reaction of a diisocyanate compound such as aliphatic diisocyanate, branched aliphatic diisocyanate, alicyclic diisocyanate, or aromatic diisocyanate, with a diol compound such as polycarbonate polyol, polyether polyol, polyester polyol, polyolefin polyol, acrylic polyol, bisphenol A alkylene oxide adduct diol, or a compound having a phenolic hydroxyl group and an alcoholic hydroxyl group into reaction with an acid anhydride.

(7) A carboxyl group-containing urethane resin obtained by adding a compound having one hydroxyl group and one or more (meth)acryloyl groups in the molecule such as hydroxyalkyl (meth)acrylate during synthesis of a carboxyl group-containing urethane resin by a polyaddition reaction of a diisocyanate, a carboxyl group-containing dialcohol compound such as dimethylolpropionic acid or dimethylolbutyric acid, and a diol compound to be terminally (meth)acrylated.

(8) A carboxyl group-containing urethane resin obtained by adding a compound having one isocyanate group and one or more (meth)acryloyl groups in the molecule such as equimolar reaction product of isophorone diisocyanate and pentaerythritol triacrylate during synthesis of a carboxyl group-containing urethane resin by a polyaddition reaction of a diisocyanate, a carboxyl group-containing dialcohol compound, and a diol compound to be terminally (meth)acrylated.

(9) A carboxyl group-containing photosensitive resin obtained by copolymerization of an unsaturated carboxylic acid such as (meth)acrylic acid with a unsaturated group-containing compound such as styrene, α-methylstyrene, lower alkyl (meth)acrylate, or isobuthylene.

(10) A carboxyl group-containing photosensitive resin obtained by bringing a polyfunctional oxetane resin as described later with a dicarboxylic acid such as adipic acid, phthalic acid, or hexahydrophthalic acid; adding a dibasic anhydride to the generated primary hydroxyl group to yield a carboxyl group-containing polyester resin; and further adding, to the obtained carboxyl group-containing polyester resin, a compound having one epoxy group and one or more (meth)acryloyl group in one molecule such as glycidyl (meth)acrylate or α-methylglycidyl (meth)acrylate.

(11) A carboxyl group-containing photosensitive resin obtained by adding a compound having a cyclic ether group and a (meth)acryloyl group in one molecule to any of the above (1) to (10) carboxyl group-containing photosensitive resins. It is to be noted that the term (meth)acrylate, when used herein, is a generic term of an acrylate, a methacrylate, and a mixture thereof; and the same is hereinafter applied to other similar expressions.

Of the carboxyl group-containing photosensitive resins described above, the carboxyl group-containing photosensitive resin that does not use an epoxy resin as a starting raw material can preferably be employed as described earlier. Accordingly, of the above specific examples of the carboxyl group-containing photosensitive resins, one or more of the carboxyl group-containing photosensitive resins (4) to (8) can in particular preferably be employed.

As just described, by not using the epoxy resin as the starting raw material, the amount of chlorine ion impurities can be reduced to a very low level of, for example, 100 ppm or less. The content of chlorine ion impurities in the carboxyl group-containing photosensitive resin that is suitably used in the present invention is 0 to 100 ppm, more preferably 0 to 50 ppm, and still more preferably 0 to 30 ppm.

In addition, by not using the epoxy resin as the starting raw material, a resin that does not contain a hydroxyl group (or in which the amount of hydroxyl group is reduced) can readily be obtained. In general, the presence of the hydroxyl group leads to excellent characteristics including an improved adhesion ascribed to a hydrogen bond. Yet, it is known to significantly decrease humidity resistance; and, by making the carboxyl group-containing photosensitive resin that does not contain the hydroxyl group, the humidity resistance can be improved.

It is to be noted that, a carboxyl group-containing urethane resin that is synthesized from a raw material that does not use epihalohydrin, an isocyanate compound that does not use phosgene as a starting raw material, and has an amount of chlorine ion impurities of 0 to 30 ppm is suitably used. In such a urethane resin, by adjusting the equivalent of the hydroxyl group and the isocyanate group, a resin that does not contain the hydroxyl group can readily be synthesized.

In addition, at the time of the synthesis of the urethane resin, an epoxy acrylate modified raw material can also be used as a diol compound. Chlorine ion impurities come to mix; but the use of epoxy acrylate modified raw material is feasible in that the amount of chlorine ion impurities can be controlled.

From this point of view, to obtain a solder resist composition having an more excellent PCT resistance, HAST resistance, and thermal shock resistance, for example, as a solder resist for semiconductor package, one or more carboxyl group-containing photosensitive resins of the above carboxyl group-containing photosensitive resins (4) to (8) can more suitably be employed.

In addition, a carboxyl group-containing photosensitive resin obtained by bringing 3,4-epoxycyclohexylmethylmethacrylate as a compound having a cyclic ether group and a (meth)acryloyl group in one molecule into reaction with the aforementioned carboxyl group-containing photosensitive resin (9) obtained by the copolymerization with the unsaturated group-containing compound can also suitably be employed because of less chlorine ion impurities ascribed to the use of alicyclic epoxy.

In addition, the use of one or more kinds of the carboxyl group-containing resin among the above (4) to (8) in conjunction with the above-mentioned carboxyl group-containing resin (9) is preferred because the adhesion thereof with the mold material improves more.

Because the above carboxyl group-containing photosensitive resin has a large number of carboxyl groups in the side chain of backbone polymers, development by an alkaline aqueous solution is feasible.

The acid value of the carboxyl group-containing photosensitive resin is preferably 40 to 150 mg KOH/g. By making the acid value of the carboxyl group-containing photosensitive resin 40 mg KOH/g or more, good alkaline development is possible. In addition, by making the acid value 150 mg KOH/g or less, normal resist pattern drawing can be become easier. More preferably, the acid value is 50 to 130 mg KOH/g.

The weight average molecular weight of the carboxyl group-containing photosensitive resin varies in resin backbone and in general preferably 2,000 to 150,000. By making the weight average molecular weight 2,000 or more, tack-free performance and resolution can be improved. In addition, by making the weight average molecular weight 150,000 or less, development properties and preservation stability can be improved. More preferably, the weight average molecular weight is 5,000 to 100,000.

The amount of the carboxyl group-containing photosensitive resin combined is preferably 20 to 60% by mass in the entire composition. By making the amount 20% by mass or more, the coating film strength can be improved. In addition, by making the amount 60% by mass or less, an appropriate viscosity is attained and the processability improves. More preferably, the amount is 30 to 50% by mass.

As the photoinitiator used for photopolymerization of the above carboxyl group-containing photosensitive resin, known photoinitiators can be used. Of those, an oxime ester photoinitiator having an oxime ester group, an α-aminoacetophenone photoinitiator, and an acyl phosphine oxide photoinitiator are preferred. One kind of photoinitiator may be solely used or two or more kinds may be used in combination.

As for the oxime ester photoinitiator, examples of a commercially available product include CGI-325, Irgacure (registered trademark) OXE01, and Irgacure OXE02, which are manufactured by BASF Japan Ltd.; and NT1919 and Adeka Arkls (registered trademark) NCI-831, which are manufactured by ADEKA Corporation.

In addition, a photoinitiator having two oxime ester groups in the molecule can be suitably used; and specific examples thereof include an oxime ester compound having a carbazole structure represented by the following general formula.

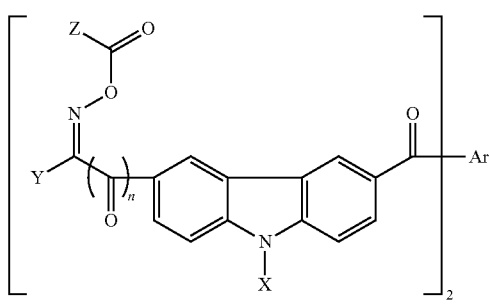

(wherein, X represents a hydrogen atom, an alkyl group having 1 to 17 carbon atoms, an alkoxy group having 1 to 8 carbon atoms, a phenyl group, a phenyl group (substituted with an alkylamino group or dialkylamino group having an alkyl group having 1 to 17 carbon atoms, an alkoxy group having 1 to 8 carbon atoms, an amino group, or an alkyl group having 1 to 8 carbon atoms), or a naphthyl group (substituted with an alkylamino group or dialkylamino group having an alkyl group having 1 to 17 carbon atoms, an alkoxy group having 1 to 8 carbon atoms, an amino group, or an alkyl group having 1 to 8 carbon atoms); Y and Z represent each a hydrogen atoms, an alkyl group having 1 to 17 carbon atoms, an alkoxy group having 1 to 8 carbon atoms, a halogen group, a phenyl group, a phenyl group (substituted with an alkylamino group or dialkylamino group having an alkyl group having 1 to 17 carbon atoms, an alkoxy group having 1 to 8 carbon atoms, an amino group, or an alkyl group having 1 to 8 carbon atoms), a naphthyl group (substituted with an alkylamino group or dialkylamino group having an alkyl group having 1 to 17 carbon atoms, an alkoxy group having 1 to 8 carbon atoms, an amino group, or an alkyl group having 1 to 8 carbon atoms), an anthryl group, a pyridyl group, a benzofuryl group, or a benzothienyl group; Ar represents an alkylene having 1 to 10 carbon atoms, vinylene, phenylene, biphenylene, pyridylene, naphthylene, thiophene, anthrylene, thienylene, furylene, 2,5-pyrrole-diyl, 4,4'-stilbene-diyl, or 4,2'-styrene-diyl; and n is an integer of 0 or 1.)

In particular, preferred is an oxime ester photoinitiator represented by the above formula wherein X and Y are each a methyl group or an ethyl group; Z is methyl or phenyl; n is 0; and Ar is phenylene, naphthylene, thiophene, or thienylene.

Preferred examples of the carbazole oxime ester compound include a compound that can be represented by the following general formula.

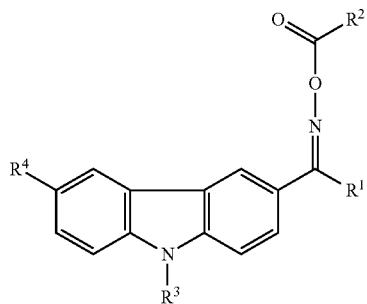

(wherein, $R^1$ represents an alkyl group having 1 to 4 carbon atoms, or a phenyl group that may be substituted with a nitro group, a halogen atom or an alkyl group having 1 to 4 carbon atoms.

$R^2$ represents an alkyl group having 1 to 4 carbon atoms, an alkoxy group having 1 to 4 carbon atoms, or a phenyl group that may be substituted with an alkyl group or alkoxy group having 1 to 4 carbon atoms.

$R^3$ may be linked with an oxygen atom or a sulphur atom and represents an alkyl group having 1 to 20 carbon atoms that may be substituted with a phenyl group or a benzyl group that may be substituted with an alkoxy group having 1 to 4 carbon atoms.

$R^4$ represents a nitro group or an acyl group represented by X—C(=O)—. X represents an aryl group, a thienyl group, a morpholino group, a thiophenyl group, or a structure represented by the following formula that may be substituted with an alkyl group having 1 to 4 carbon atoms.)

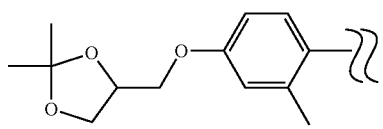

Besides, examples include carbazole oxime ester compounds described in Japanese Patent Application Laid-Open Publication No. 2004-359639, Japanese Patent Application Laid-Open Publication No. 2005-097141, Japanese Patent Application Laid-Open Publication No. 2005-220097, Japanese Patent Application Laid-Open Publication No. 2006-160634, Japanese Patent Application Laid-Open Publication No. 2008-094770, Japanese Translated PCT Patent Application Laid-Open No. 2008-509967, Japanese Translated PCT Patent Application Laid-open No. 2009-040762, and Japanese Patent Application Laid-Open Publication No. 2011-80036.

In cases where the oxime ester photoinitiator is used, the amount of the oxime ester photoinitiator combined is preferably set to 0.01 to 5 parts by mass based on 100 parts by mass of the carboxyl group-containing photosensitive resin. By making the amount 0.01 parts by mass or more, the photocurability on copper is more secured and coating film characteristic such as chemical resistance improve. In addition, by making the amount 5 parts by mass or less, light absorption on the surface of the coating film is inhibited and the curability in deep portions tends to improve. More preferably, the amount is 0.5 to 3 parts by mass based on 100 parts by mass of the carboxyl group-containing photosensitive resin.

Specific examples of the α-aminoacetophenone photoinitiator include 2-methyl-1-[4-(methylthio)phenyl]-2-morpholino propanone-1,2-benzyl-2-dimethylamino-1-(4-morpholino phenyl)-butane-1-one, 2-(dimethylamino)-2-[(4-methylphenyl)methyl]-1-[4-(4-morpholinyl)phenyl]-1-butanone, and N,N-dimethylaminoacetophenone. Examples of a commercially available product include Irgacure 907, Irgacure 369, and Irgacure 379, which are manufactured by BASF Japan Ltd.

Specific examples of the acyl phosphine oxide photoinitiator include 2,4,6-trimethylbenzoyl diphenylphosphine oxide, bis(2,4,6-trimethylbenzoyl)-phenylphosphine oxide, and bis(2,6-dimethoxybenzoyl)-2,4,4-trimethyl-pentylphosphine oxide. Examples of a commercially available product include Lucirin (registered trade mark) TPO and Irgacure 819, which are manufactured by BASF Japan Ltd.

In cases where the α-aminoacetophenone photoinitiator or the acyl phosphine oxide photoinitiator is used, the amount of each is preferably 0.01 to 15 parts by mass based on 100 parts by mass of the carboxyl group-containing photosensitive resin. By making the amount 0.01 parts by mass or more, the photocurability on copper is more secured and coating film characteristic such as chemical resistance improve. In addition, by making the amount 15 parts by mass or less, a sufficient reducing effect for outgas is attained. Further, light absorption on the surface of the cured coating film is inhibited and the curability in deep portions improves. More preferably, the amount is 0.5 to 10 parts by mass based on 100 parts by mass of the carboxyl group-containing photosensitive resin.

In addition, Irgacure 389 and Irgacure 784, which are manufactured by BASF Japan Ltd. can suitably be employed as the photoinitiator.

In conjunction with the above photoinitiator, a photoinitiation auxiliary agent or a sensitizer may be used. Examples of the photoinitiation auxiliary agent or the sensitizer can include a benzoin compound, an acetophenone compound, an anthraquinone compound, a thioxanthone compound, a ketal compound, a benzophenone compound, a tertiary amine compound, and a xanthone compound. These compounds may in some cases be used as the photoinitiator but are preferably used in conjunction with the photoinitiator. Further, one kind of the photoinitiation auxiliary agent or the sensitizer may be used solely; or two or more kinds thereof may be used in combination.

Examples of the benzoin compound include benzoin, benzoinmethyl ether, benzoinethyl ether, and benzoinisopropyl ether. Further, examples of the acetophenone compound include acetophenone, 2,2-dimethoxy-2-phenylacetophenone, 2,2-diethoxy-2-phenylacetophenone, and 1,1-dichloroacetophenone. Further, examples of the anthraquinone compound include 2-methylanthraquinone, 2-ethyl anthraquinone, 2-t-butylanthraquinone, and 1-chloroanthraquinone. Further, examples of the thioxanthone compound include 2,4-dimethyl thioxanthone, 2,4-diethyl thioxanthone, 2-chlorothioxanthone, and 2,4-diisopropyl thioxanthone. Further, examples of the ketal compound include acetophenone dimethyl ketal and benzyl dimethyl ketal. Further, examples of the benzophenone compound include benzophenone, 4-benzoyl diphenyl sulfide, 4-benzoyl-4'-methyldiphenyl sulfide, 4-benzoyl-4'-ethyl diphenyl sulfide, and 4-benzoyl-4'-propyl diphenyl sulfide.

Examples of the tertiary amine compound include an ethanolamine compound, a compound having a dialkylaminobenzene structure, for example, in a commercially available product, dialkylamino benzophenone such as 4,4'-dimethylamino benzophenone (Nissocure (registered trademark) MABP manufactured by Nippon Soda Co., Ltd.) and 4,4'-diethylamino benzophenone (EAB manufactured by Hodogaya Chemical Co., Ltd.), a dialkylamino group-containing coumarin compound such as 7-(diethylamino)-4-methyl-2H-1-benzopyran-2-one(7-(diethylamino)-4-methylcoumarin), 4-dimethylaminobenzoic acid ethyl (Kayacure (registered trademark) EPA manufactured by Nippon Kayaku Co., Ltd.), 2-dimethylaminobenzoic acid ethyl (Quant a cure DMB manufactured by International Bio-synthetics), 4-dimethylaminobenzoic acid (n-butoxy) ethyl (Quantacure BEA manufactured by International Bio-synthetics), p-dimethylaminobenzoic acid isoamyl ethyl ester (Kayacure DMBI manufactured by Nippon Kayaku Co., Ltd.), and 2-ethylhexyl 4-(dimethylamino)benzoatel (Esolo1507 manufactured by Van Dyk). As the tertiary amine compound, the compound having a dialkylaminobenzene structure is preferred. Of those, a dialkylamino benzophenone compound, a dialkylamino group-containing coumarin compound with a maximum absorption wavelength of 350 to 450 nm, and ketocoumarins are in particular preferred.

As the dialkylamino benzophenone compound, 4,4'-diethylamino benzophenone is preferred due to its low toxicity. Because of the maximum absorption wavelength of the dialkylamino group-containing coumarin compound is 350 to 410 nm which is in an ultraviolet range, it is possible to obtain not only a photosensitive composition that has less coloration or is colorless and transparent but also a colored solder resist film that is made by using a colored pigment and into which the color of the colored pigment itself is incorporated. In particular, 7-(diethylamino)-4-methyl-2H-1-benzopyran-2-one is preferred because it exhibits an excellent sensitizing effect to laser light with a wavelength of 400 to 410 nm.

Of these, the thioxanthone compound and the tertiary amine compound are preferred. In particular, by containing the thioxanthone compound, the curability in deep portions can be improved.

The total amount of the photoinitiator, the photoinitiation auxiliary agent, and the sensitizer is preferably 35 parts by mass or less based on 100 parts by mass of the carboxyl group-containing photosensitive resin. By making it 35 parts by mass or less, the light absorption thereof is inhibited and the curability in deep portions improves as well.

It is to be noted that because these photoinitiator, photoinitiation auxiliary agent, and sensitizer absorb a specific wavelength, they may in some cases function as ultraviolet absorbents because of decreased sensitivity. Yet, these are not used only for the purpose of improving the sensitivity of the composition. Light with a specific wavelength can be absorbed as necessary. the photoreactivity of the surface can be increased. The line shape and opening of the resist can be changed to a vertical shape, a tapered shape, or a reversed tapered shape. Besides, processing accuracy of the width of line and a diameter of opening can be improved.

The resin composition used for the photosensitive resin layer may contain a thermosetting component for the purpose of improving the characteristics such as thermal resistance or insulation reliability. As the thermosetting component, a commonly-used known thermosetting resin such as an isocyanate compound, a blocked isocyanate compound, an amino resin, a maleimide compound, a benzoxazine resin, a carbodiimide resin, a cyclocarbonate compound, a polyfunctional epoxy compound, a polyfunctional oxetane compound, or an episulfide resin can be used. Of these, a preferred thermosetting component is a thermosetting component having plural cyclic ether groups and/or cyclic thioether groups (hereinafter, shortened to cyclic (thio)ether groups) in one molecule. As for the thermosetting component having these cyclic (thio)ether groups, many kinds are commercially available and various characteristics can be imparted by the structure.

The thermosetting component having plural cyclic (thio) ether groups in the molecule include a compound having plural groups in the molecule, which groups are either 3-, 4-, or 5-membered cyclic ether groups or cyclic thioether groups, or both kinds of the groups; and examples of thereof include a compound having plural epoxy groups in the molecule, that is, a polyfunctional epoxy compound; a compound having plural oxetanyl groups in the molecule, that is, a polyfunctional oxetane compound; and a compound having plural thioether groups in the molecule, that is, an episulfide resin.

Examples of the polyfunctional epoxy compound include, but are not limited to, bisphenol A-type epoxy resins such as jER828, jER834, jER1001, and jER1004 which are manufactured by Mitsubishi Chemical Corporation, Epiclon 840, Epiclon 850, Epiclon 1050, and Epiclon 2055 which are manufactured by DIC Corporation, Epotohto YD-011, YD-013, YD-127, and YD-128 which are manufactured by Tohto Kasei Co., Ltd., D.E.R.317, D.E.R.331, D.E.R.661, and D.E.R.664 which are manufactured by Dow Chemical Company, Sumi-Epoxy ESA-011, ESA-014, ELA-115, and ELA-128 which are manufactured by Sumitomo Chemical Co., Ltd., and A.E.R.330, A.E.R.331, A.E.R.661, and A.E.R.664 which are manufactured by Asahi Kasei Corp. (all of which are trade names); brominated epoxy resins such as jERYL903 manufactured by Mitsubishi Chemical Corporation, Epiclon 152 and Epiclon 165 which are manufactured by DIC Corporation, Epotohto YDB-400 and YDB-500 which are manufactured by Tohto Kasei Co., Ltd., D.E.R.542 manufactured by Dow Chemical Company, Sumi-Epoxy ESB-400 and ESB-700 which are manufactured by Sumitomo Chemical Co., Ltd., and A.E.R.711 and A.E.R.714 which are manufactured by Asahi Kasei Corp. (all of which are trade names); novolak-type epoxy resins such as jER152 and jER154 which are manufactured by Mitsubishi Chemical Corporation, D.E.N.431 and D.E.N.438 which are manufactured by Dow Chemical Company, Epiclon N-730, Epiclon N-770, and Epiclon N-865 which are manufactured by DIC Corporation, Epotohto YDCN-701 and YDCN-704 which are manufactured by Tohto Kasei Co., Ltd., EPPN-201, EOCN-1025, EOCN-1020, EOCN-104S, RE-306, and NC-3000H which are manufactured by Nippon Kayaku Co., Ltd., Sumi-EpoxyESCN-195X and ESCN-220 which are manufactured by Sumitomo Chemical Co., Ltd., A.E.R.ECN-235 and ECN-299 which are manufactured by Asahi Kasei Corp. (all of which are trade names); bisphenol F-type epoxy resins such as Epiclon 830 manufactured by DIC Corporation, jER807 manufactured by Mitsubishi Chemical Corporation, and Epotohto YDF-170, YDF-175, and YDF-2004 which are manufactured by Tohto Kasei Co., Ltd. (all of which are trade names); hydrogenated bisphenol A-type epoxy resins such as Epotohto ST-2004, ST-2007, and ST-3000 (trade names) which are manufactured by Tohto Kasei Co., Ltd.; glycidyl amine-type epoxy resins such asjER604 manufactured by Mitsubishi Chemical Corporation, Epotohto YH-434 manufactured by Tohto Kasei Co., Ltd., Sumi-Epoxy ELM-120 manufactured by Sumitomo Chemical Co., Ltd. (all of which are trade names); alicyclic epoxy resins such as Celloxide 2021 (trade name) manufactured by Daicel Corporation; trihydroxyphenyl methane-type epoxy resins such as YL-933 manufactured by Mitsubishi Chemical Corporation, T.E.N., EPPN-501, and EPPN-502 which are manufactured by Dow Chemical Company (all of which are trade names); bixylenol-type or biphenol-type epoxy resins or mixtures thereof such as YL-6056, YX-4000, and YL-6121 (all of which are trade names) which are manufactured by Mitsubishi Chemical Corporation; bisphenol S-type epoxy resins such as EBPS-200 manufactured by Nippon Kayaku Co., Ltd., EPX-30 manufactured by Asahi Denka Co., Ltd., EXA-1514 (trade name) manufactured by DIC Corporation; bisphenol A novolak-type epoxy resins such as jER157S (trade name) manufactured by Mitsubishi Chemical Corporation; tetraphenylol ethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as Blemmer DGT manufactured by Nippon Oil & Fats Co., Ltd.; tetraglycidyl xylenoyl ethane resins such as ZX-1063 manufactured by Tohto Kasei Co., Ltd.; naphthalene group-containing epoxy resins such as ESN-190 and ESN-360 which are manufactured by Nippon Steel Chemical Co., Ltd. and HP-4032, EXA-4750, and EXA-4700 which are manufactured by DIC Corporation; epoxy resins having a dicyclopentadiene backbone such as HP-7200 and HP-7200H and flexible tough epoxy resins of EXA-4816, EXA-4822, and EXA-4850 series which are manufactured by DIC Corporation; epoxy resins based on glycidyl methacrylate copolymerization such as CP-50S and CP-50M which are manufactured by Nippon Oil & Fats Co., Ltd.; and further copolymerization epoxy resins of cyclohexylmaleimide and glycidyl methacrylate. These epoxy resins can be used solely; or two or more kinds thereof can be used in combination.

Examples of the polyfunctional oxetane compound include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and an oligomer or an copolymer thereof; and, in addition to those, examples include a etherification product of oxetanealcohol with a resin having a hydroxyl group such as novolak resin, poly(p-hydroxy styrene), cardo-type bisphenols, calixarenes, calixresorcinarenes, or silsesquioxane. Besides, examples include a copolymer of an unsaturated monomer having an oxetane ring and alkyl (meth)acrylate.

Examples of the episulfide resin having plural cyclic thioether groups in the molecule include YL7000 (bisphenol A-type episulfide resin) manufactured by Mitsubishi Chemical Corporation. In addition, an episulfide resin obtained by replacing an oxygen atom of the epoxy group of novolak-type epoxy resin with a sulphur atom using the same synthesis method can be used as well.

The amount of the thermosetting component having plural cyclic (thio)ether groups in the molecule is in a range of preferably 0.3 to 2.5 equivalents, more preferably 0.5 to 2.0 equivalents based on 1 equivalent of the carboxyl group of the carboxyl group-containing photosensitive resin. By making the amount of the thermosetting component having plural cyclic (thio)ether groups in the molecule 0.3 equivalents or more, the carboxyl group does not remain on the cured coating film; and the thermal resistance, alkaline resistance, electrical insulation property, and the like improve. In addition, by making the amount 2.5 equivalents or less, a low molecular weight cyclic (thio)ether group does not remain on the dried coating film; and the strength of the cured coating film and the like improve.

In cases where the thermosetting component having plural cyclic (thio)ether groups in the molecule is used, it is preferred to contain a heat curing catalyst. Examples of such a heat curing catalyst include imidazole, imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; dicyandiamide, amine compounds such as benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic dihydrazide and sebacic dihydrazide; and phosphorus compounds such as triphenylphosphine. In addition, examples of one that is commercially available include 2MZ-A, 2MZ-OK, 2PHZ, 2P4BHZ, 2P4 MHz (all are trade names of imidazole-based compounds), which are manufactured by Shikoku Chemicals Corporation; and U-CAT (registered trademark) 3503N, U-CAT 3502T (all are trade names of blocked isocyanate compounds of dimethyl amine), DBU, DBN, U-CAT SAIO2, U-CAT 5002 (all are bicyclic amidine compounds and salts thereof) which are manufactured by San-Apro Ltd. The catalyst is not in particular limited to these; and may be a heat curing catalyst for an epoxy resin or an oxetane compound, or one that promotes a reaction of an epoxy group and/or an oxetanyl group with a carboxyl group. The catalyst may be used solely; or two or more kinds thereof may be mixed to be used. In addition, guanamine, acetoguanamine, benzoguanamine, melamine, and S-triazine derivatives such as 2,4-diamino-6-methacryloyloxyethyl-S-triazine, 2-vinyl-2,4-diamino-S-triazine, a 2-vinyl-4,6-diamino-S-triazine-isocyanuric acid adduct, and a 2,4-diamino-6-methacryloyloxyethyl-S-triazine-isocyanuric acid adduct can be used. Preferably, these compounds which function also as adhesion imparting agents are used in conjunction with the heat curing catalyst.

The amount of the heat curing catalyst combined is preferably 0.1 to 20 parts by mass and more preferably 0.5 to 15.0 parts by mass based on 100 parts by mass of the thermosetting component having plural cyclic (thio)ether groups in the molecule.

Examples of the amino resin include an amino resin such as a melamine derivative or a benzoguanamine derivative. Examples are a methylol melamine compound, a methylol benzoguanamine compound, a methylol glycoluril compound, a methylolurea compound, and the like. Further, an alkoxy methylated melamine compound, an alkoxy methylated benzoguanamine compound, an alkoxy methylated glycoluril compound, and an alkoxy methylated urea compound are obtained by converting the methylol group of a methylol melamine compound, a methylol benzoguanamine compound, a methylol glycoluril compound, and a methylolurea compound, respectively, to an alkoxy methyl group. The kind of this alkoxy methyl group is not in particular restricted; and a methoxymethyl group, an ethoxy methyl group, a propoxymethyl group, a butoxy methyl group, and the like can, for example, be used. A melamine derivative with a formalin concentration of 0.2% or less that is friendly to the human body and the environment is in particular preferred.

Examples of a commercially available product of amino resin can include Cymel 300, Cymel 301, Cymel 303, Cymel 370, Cymel 325, Cymel 327, Cymel 701, Cymel 266, Cymel 267, Cymel 238, Cymel 1141, Cymel 272, Cymel 202, Cymel 1156, Cymel 1158, Cymel 1123, Cymel 1170, Cymel 1174, Cymel UFR65, Cymel 300 (all of which are manufactured by Mitsui Cyanamid Co., Ltd.); and Nikalac Mx-750, Nikalac Mx-032, Nikalac Mx-270, Nikalac Mx-280, Nikalac Mx-290, Nikalac Mx-706, Nikalac Mx-708, Nikalac Mx-40, Nikalac Mx-31, Nikalac Ms-11, Nikalac Mw-30, Nikalac Mw-30HM, Nikalac Mw-390, Nikalac Mw-100LM, Nikalac Mw-750LM, (all of which are manufactured by Sanwa Chemical Co., Ltd.).

As the isocyanate compound, a polyisocyanate compound having plural isocyanate groups in the molecule can be used. As the polyisocyanate compound, an aromatic polyisocyanate, an aliphatic polyisocyanate, or an alicyclic polyisocyanate is for example used. Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate, and a 2,4-tolylene dimer. Specific examples of the aliphatic polyisocyanate include tetramethylene diisocyanate, hexamethylene diisocyanate, methylene diisocyanate, tri methyl hexa methylene diisocyanate, 4,4-methylene bis(cyclohexyl isocyanate), and isophorone diisocyanate. Specific examples of the alicyclic polyisocyanate include bicycloheptane triisocyanate. Also included are an adduct product, biuret product, and isocyanurate product of the isocyanate compound listed earlier.

A blocked isocyanate group contained in the blocked isocyanate compound is an isocyanate group that is protected by a reaction with a blocking agent to be transiently inactivated. When the compound is heated to a predetermined temperature, the blocking agent is dissociated to generate the isocyanate group.

As the blocked isocyanate compound, an addition reaction product of the isocyanate compound and the isocyanate blocking agent is used. Examples of the isocyanate compound that can react with the blocking agent include an isocyanurate type, a biuret type, and an adduct type. Examples of the isocyanate compound used for synthesizing the blocked isocyanate compound include aromatic polyisocyanate, aliphatic polyisocyanate, and alicyclic polyisocyanate. Specific examples of the aromatic polyisocyanate, aliphatic polyisocyanate, and alicyclic polyisocyanate include compounds described earlier as examples.

Examples of the isocyanate blocking agent include a phenolic blocking agent such as phenol, cresol, xylenol, chlorophenol, and ethyl phenol; a lactam blocking agent such as ε-caprolactam, δ-valerolactam, γ-butyrolactam, and β-propiolactam; an active methylene-based blocking agent such as ethyl acetoacetate and acetylacetone; an alcohol-based blocking agent such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; an oxime-based blocking agent such as formaldehyde oxime, acetone aldoxime, acetoxime, methyl ethyl ketoxime, diacetyl mono oxime, and cyclohexane oxime; a mercaptan-based blocking agent such as butyl mercaptan, hexyl mercaptan, t-butyl mercaptan, thiophenol, methyl thiophenol, and ethyl thiophenol; an acid amide-based blocking agent such as acetamide and benzamide; an imide-based blocking agent such as succinimide and maleimide; an amine-based blocking agent such as xylydine, aniline, butylamine, and dibutylamine; an imidazole-based blocking agent such as imidazole and 2-ethyl imidazole; and an imine-based blocking agent such as methyleneimine and propyleneimine.

A commercially available blocked isocyanate compound may also be used; and examples thereof include Sumidur BL-3175, BL-4165, BL-1100, BL-1265, Desmodur TPLS-2957, TPLS-2062, TPLS-2078, TPLS-2117, Desumosamu 2170, Desumosamu 2265 (all of which are manufactured by Sumitomo Bayer Urethane Co., Ltd., trade name); Coronate 2512, Coronate 2513, Coronate 2520 (all of which are manufactured by Nippon Polyurethane Industry Co., Ltd., trade name); B-830, B-815, B-846, B-870, B-874, B-882 (all of which are manufactured by Mitsui Takeda Chemicals, Inc., trade name); and TPA-B80E, 17B-60PX, E402-B80T (all of which are manufactured by Asahi Kasei Chemicals Corp., trade name). It is to be noted that Sumidur BL-3175 and BL-4265 are obtained using methyl ethyl oxime as a blocking agent.

To the photosensitive resin composition, a urethanation catalyst may be added for promoting a curing reaction of a hydroxyl group or a carboxyl group with an isocyanate group. As for the urethanation catalyst, it is preferred to use a urethanation catalyst selected from at least one kind of tin-based catalysts, metal chlorides, metal acetylacetonates, metal sulfates, amine compounds, and amine salts.

Examples of the tin-based catalyst include an organic tin compound and an inorganic tin compound such as stannous octoate and dibutyltin dilaurate. Further, as the metal chloride, a chloride of a metal selected from the group consisting of Cr, Mn, Co, Ni, Fe, Cu, and Al is used; and examples thereof include cobaltic chloride, nickel(II) chloride, and iron(III) chloride. Further, the metal acetylacetonate is an acetylacetonate of a metal selected from the group consisting of Cr, Mn, Co, Ni, Fe, Cu, and Al; examples thereof include cobalt acetylacetonate, nickel acetylacetonate, and iron acetylacetonate. Further, as the metal sulfate, a sulfate of a metal selected from the group consisting of Cr, Mn, Co, Ni, Fe, Cu, and Al; examples thereof include copper sulfate.

Examples of the amine compound include conventionally known triethylenediamine, N,N,N',N'-tetramethyl-1,6-hexanediamines, bis(2-dimethylaminoethyl)ether, N,N,N', N'',N''-pentamethyl diethylene triamine, N-methyl morpholine, N-ethyl morpholine, N,N-dimethyl ethanolamine, dimorpholino diethyl ether, N-methyl imidazole, dimethylaminopyridine, triazine, N'-(2-hydroxyethyl)-N,N,N'-trimethyl-bis(2-amino ethyl)ether, N,N-dimethyl hexanolamine, N,N-dimethylamino ethoxy ethanol, N,N,N'-trimethyl-N'-(2-hydroxyethyl)ethylenediamine, N-(2-hydroxyethyl)-N, N',N'',N''-tetramethyl diethylene triamine, N-(2-hydroxypropyl)-N,N',N'',N''-tetramethyl diethylene triamine, N,N, N'-trimethyl-N'-(2-hydroxyethyl)propane diamine, N-methyl-N'-(2-hydroxyethyl)piperazine, bis(N,N-di methylaminopropyl)amine, bis(N,N-dimethylaminopropyl)isopropanol amine, 2-aminoquinuclidine, 3-aminoquinuclidine, 4-aminoquinuclidine, 2-quinuclidiol, 3-quinuclidinol, 4-quinuclidinol, 1-(2'-hydroxypropyl)imidazole, 1-(2'-hydroxypropyl)-2-methyl imidazole, 1-(2'-hydroxyethyl)imidazole, 1-(2'-hydroxyethyl)-2-methyl imidazole, 1-(2'-hydroxypropyl)-2-methyl imidazole, 1-(3'-aminopropyl)imidazole, 1-(3'-aminopropyl)-2-methyl imidazole, 1-(3'-hydroxypropyl)imidazole, 1-(3'-hydroxypropyl)-2-methyl imidazole, N,N-dimethylamino propyl-N'-(2-hydroxyethyl) amine, N,N-dimethylaminopropyl-N',N'-bis(2-hydroxyethyl)amine, N,N-dimethylamino propyl-N',N'-bis(2-hydroxypropyl)amine, N,N-di methylaminoethyl-N',N'-bis(2-hydroxyethyl)amine, N,N-dimethylaminoethyl-N',N'-bis(2-hydroxypropyl)amine, melamine or/and benzoguanamine.

Examples of the amine salt include an organic salt-based amine salt such as DBU (1,8-diaza-bicyclo[5.4.0]undecene-7).

In addition to the carboxyl group-containing photosensitive resin, the photoinitiator, and the thermosetting component, a photosensitive monomer may be contained in the photosensitive resin composition used for the photosensitive dry film according to the present invention. The photosensitive monomer is a compound having one or more ethylenically unsaturated groups in the molecule. The photosensitive monomer promotes the photo-curing of carboxyl group-containing photosensitive resin by active energy ray irradiation.

Examples of a compound used as the photosensitive monomer include commonly-used known polyester (meth) acrylate, polyether (meth)acrylate, urethane (meth)acrylate, carbonate (meth)acrylate, and epoxy (meth)acrylate. To be specific, at least one selected as appropriate from the following can be used: hydroxyalkyl acrylates such as 2-hydroxyethyl acrylate or 2-hydroxy propyl acrylate; diacrylates of glycol such as ethylene glycol, methoxytetra ethylene glycol, polyethylene glycol, or propylene glycol; acrylamides such as N,N-dimethyl acrylamide, N-methylolacrylamide, or N,N-dimethylamino propyl acrylamide; amino alkyl acrylates such as N,N-dimethylamino ethyl acrylate or N,N-dimethylamino propyl acrylate; polyacrylates such as polyalcohol such as hexanediol, trimethylolpropane, pentaerythritol, dipentaerythritol, or tris-hydroxyethyl isocyanurate, or an ethylene oxide adduct, propylene oxide adduct, or ε-caprolactone adduct thereof; polyacrylates such as phenoxy acrylate, bisphenol A diacrylate, and an ethylene oxide adduct or propylene oxide adduct of those phenols; polyacrylates of glycidyl ether such as glycerin diglycidyl ether, glycerin triglycidyl ether, trimethylolpropane triglycidyl ether, or triglycidyl isocyanurate; and, besides the above, acrylates obtained by subjecting polyols such as polyether polyol, polycarbonate diol, hydroxyl-terminated polybutadiene, or polyester polyol to direct acrylation or urethane acrylation via diisocyanate, and melamine acrylates; and each of methacrylates corresponding to the above-mentioned acrylates.

An epoxy acrylate resin obtained by bringing a polyfunctional epoxy resin such as a cresol novolak-type epoxy resin into reaction with acrylic acid, an epoxyurethane acrylate compound obtained by further bringing the hydroxyl group of the epoxy acrylate resin into reaction with a hydroxy acrylate such as pentaerythritol triacrylate and a halfurethane compound of diisocyanate such as isophorone diisocyanate, and the like may be used as the photosensitive monomer. Such an epoxy acrylate-based resin can improve the photocurability without decreasing the property of drying to set to touch.

The amount of the compound having the ethylenically unsaturated group in the molecule used as the photosensitive monomer is a ratio of preferably 5 to 100 parts by mass and more preferably 5 to 70 parts by mass based on 100 parts by mass of the carboxyl group-containing photosensitive resin. By making the amount of the compound having the ethylenically unsaturated group 5 parts by mass or more, the photocurability of the photocurable resin composition improves. In addition, by making the amount 100 parts by mass or less, the hardness of the coating film can be improved.

Besides the above components, other components such as a block copolymer, a filler, a colorant, an elastomer, a thermoplastic resin may be contained in the photosensitive resin composition used for the photosensitive dry film according to the present invention. These components will be also described below.

The block copolymer can suitably be combined in the above photosensitive resin composition. The block copolymer refers to a copolymer with a molecular structure in which two or more kinds of polymers having different properties are linked by a covalent bond to be a long chain. Preferred is one that is solid in a range of 20° C. to 30° C. It only need to be solid in this range; and may also be solid at temperature out of this range. By being solid in the above temperature range, an excellent tackiness is attained when the block copolymer is formed into a dry film or applied to a base material and transiently dried.

As the block copolymer, an ABA or ABA' block copolymer is preferred. Of the ABA or ABA' block copolymer, preferred is one composed of a polymer unit in which B in the center is a soft block and has a low glass transition point Tg, preferably below 0° C., and A or A' in both outside of B is a hard block and has a high Tg, preferably 0° C. or more. Glass transition point Tg is measured by differential scanning calorimetry (DSC).

In addition, among the ABA or ABA' block copolymers, more preferred is a block copolymer that is composed of A or A' composed of a polymer unit with a Tg of 50° C. or more and B composed of a polymer unit with a Tg of −20° C. or less. In addition, among the ABA or ABA' block copolymers, one in which A or A' exhibits a high compatibility with the carboxyl group-containing photosensitive resin is preferred; and one in which B exhibits a low compatibility with carboxyl group-containing photosensitive resin is preferred. As just described above, by making a block copolymer in which the blocks at both ends are compatible with the matrix and the block in the center is not compatible with the matrix, it is believed that the copolymer is easy to exhibit a specific structure in the matrix.

It is to be noted that, in addition to the ABA or ABA' block copolymer, any block copolymer can be used without any particular limitation as long as it has at least one kind of each of the hard block and soft block components.

Polymethyl methacrylate (PMMA), polystyrene (PS), or the like is preferred as the A or A' component; and poly n-butylacrylate (PBA), polybutadiene (PB) or the like is preferred as the B component. In addition, by introducing, in a part of the A or A' component, a hydrophilic unit with an excellent compatibility with the above carboxyl group-containing photosensitive resin represented by a styrene unit, a hydroxyl group-containing unit, a carboxyl group-containing unit, an epoxy-containing unit, an N-substituted acrylamide unit, or the like, it is possible to further improve the compatibility. The present inventors has found out that the compatibility of the thus obtained block copolymer with the above carboxyl group-containing photosensitive resin is in particular good; surprisingly the thermal shock resistance can be improved; and more surprisingly one added with an elastomer has a tendency of having a decreased glass transition temperature (Tg) whereas one added with the above-mentioned block copolymer has a tendency that Tg does not decrease.

Example of a method of producing the block copolymer include a method described in Japanese Patent Application No. 2005-515281 and a method described in Japanese Patent Application No. 2007-516326.

Examples of a commercially available product of block copolymer include an acrylic triblock copolymer manufactured by Arkema K. K. which is produced using living polymerization. Examples include an SBM type represented by polystyrene-polybutadiene-polymethyl methacrylate, an MAM type represented by polymethyl methacrylate-polybutylacrylate-polymethyl methacrylate, and further an MAM N type or an MAM A type which are subjected to a carboxylic acid-modified or carboxylic acid-modified or a hydrophilic group-modified treatment. Examples of the SBM type include E41, E40, E21, and E20. Examples of the MAM type include M51, M52, M53, and M22. Examples of the MAM N type include 52N and 22N. Examples of the MAM A type include SM4032XM10. In addition, Kurarity manufactured by Kuraray Co., Ltd. is also block copolymer induced by methyl methacrylate and butyl acrylate.

As the block copolymer, a block copolymer derived from three or more distinct monomers is preferred. A block copolymer with a precisely controlled molecular structure that is synthesized by a living polymerization method is more preferred from the viewpoint of attaining the effect of the present invention. This is considered to be because the block copolymer synthesized by the living polymerization method has a narrow molecular weight distribution and a clear characteristic of each unit. The molecular weight distribution of the employed block copolymer is preferably 2.5 or less and further preferably 2.0 or less.

The weight average molecular weight of the block copolymer is in general in a range of 20,000 to 400,000 and further preferably 30,000 to 300,000. If the weight average molecular weight is less than 20,000, intended effects of toughness and flexibility are not attained and tackiness is poor.

On the other hand, if the weight average molecular weight exceeds 400,000, the viscosity of the photocurable resin composition increases and printing and development properties significantly deteriorate.

The amount of the block copolymer added is preferably in a range of 1 to 50 parts by mass and more preferably 5 to 35 parts by mass based on 100 parts by mass of the carboxyl group-containing photosensitive resin. If it is less than one part by mass, the effect is not expected; and if it is 50 parts by mass or more, development properties and application properties as the photocurable resin composition may in some cases deteriorate.

A filler can be combined in the photosensitive resin composition as necessary for the purpose of increasing the physically strength and the like of the obtained cured product. As the filler, a commonly-used known inorganic or organic filler can be used; and barium sulfate, spherical silica, Neuburg siliceous earth particle, and talc are in particular preferably used. In addition, aluminum hydroxide, magnesium hydroxide, boehmite and the like can be used for the purpose of imparting flame retardance. Further, a compound having one or more ethylenically unsaturated groups, NANOCRYL (trade name), which is made by dispersing nanosilica in the above-mentioned polyfunctional epoxy resin, XP 0396, XP 0596, XP 0733, XP 0746, XP 0765, XP 0768, XP 0953, XP 0954, XP 1045 (all of which are product grade names), which are manufactured by Hanse-Chemie, and NANOPDX (trade name) XP 0516, XP 0525, XP 0314 (all of which are product grade names), which are manufactured by Hanse-Chemie can also be used. These can be used solely; or two or more kinds thereof can be combined.

The amount of the filler added is, based on 100 parts by mass of the carboxyl group-containing photosensitive resin, preferably 500 parts by mass or less, more preferably 0.1 to 300 parts by mass, and in particular preferably 0.1 to 150 parts by mass. If the amount of the filler added exceeds 500 parts by mass, the viscosity of the photosensitive resin composition increases and printing properties may decrease or the cured product may be brittle, which is not preferred.

The colorant may be contained in the photosensitive resin composition. As the colorant, a known colorant such as red, blue, green, or yellow can be used; and any of pigment, dye, and coloring matter may be used. Note that it is preferably not to contain halogens from the viewpoint of reduction of environmental load and effects on the human body.

As the red color colorant, monoazo-based, disazo-based, azo lake-based, benzimidazolone-based, perylene-based, diketopyrrolopyrrole-based, condensed azo-based, anthraquinone-based, quinacridone-based red color colorant, and the like are available; and specific examples thereof include those given Colour Index International (C.I.; published by The Society of Dyers and Colourists) numbers as shown below.

Examples of the monoazo-based red color colorant include Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, and 269.

Further, examples of the disazo-based red color colorant include Pigment Red 37, 38, and 41. Further, examples of the monoazo lake-based red color colorant include Pigment Red 48:1, 48:2, 48:3, 48:4, 49:1, 49:2, 50:1, 52:1, 52:2, 53:1, 53:2, 57:1, 58:4, 63:1, 63:2, 64:1, and 68. Further, examples of the benzimidazolone-based red color colorant include Pigment Red 171, 175, 176, 185, and 208. Further, examples of the perylene-based red color colorant include Solvent Red 135, 179, Pigment Red 123, 149, 166, 178, 179, 190, 194, and 224. Further, examples of the diketopyrrolopyrrole-based red color colorant include Pigment Red 254, 255, 264, 270, and 272. Further, examples of the condensed azo-based red color colorant include Pigment Red 220, 144, 166, 214, 220, 221, and 242. Further, examples of the anthraquinone-based red color colorant include Pigment Red 168, 177, and 216, Solvent Red 149, 150, 52, and 207. Further, examples of the quinacridone-based red color colorant include Pigment Red 122, 202, 206, 207, and 209.

As the blue color colorant, phthalocyanine-based and anthraquinone-based colorants are available. Examples of the pigment-based colorant include compounds classified as Pigment, for example, Pigment Blue 15, 15:1, 15:2, 15:3, 15:4, 15:6, 16, and 60. As the dye-based blue color colorant, Solvent Blue 35, 63, 68, 70, 83, 87, 94, 97, 122, 136, 67, 70, and the like can be used. Besides, metal-substituted or unsubstituted phthalocyanine compounds can be sued as well.

As the yellow color colorant, monoazo-based, disazo-based, condensed azo-based, benzimidazolone-based, isoindolinone-based, anthraquinone-based yellow color colorants, and the like are available; and examples of the anthraquinone-based yellow color colorant include Solvent Yellow 163, Pigment Yellow 24, 108, 193, 147, 199, and 202. Examples of the isoindolinone-based yellow color colorant include Pigment Yellow 110, 109, 139, 179, and 185. Examples of the condensed azo-based yellow color colorant include Pigment Yellow 93, 94, 95, 128, 155, 166, and 180. Examples of the benzimidazolone-based yellow color colorant include Pigment Yellow 120, 151, 154, 156, 175, and 181. Further, examples of the monoazo-based yellow color colorant include Pigment Yellow 1, 2, 3, 4, 5, 6, 9, 10, 12, 61, 62, 62:1, 65, 73, 74, 75, 97, 100, 104, 105, 111, 116, 167, 168, 169, 182, and 183. Further, examples of the disazo-based yellow color colorant include Pigment Yellow 12, 13, 14, 16, 17, 55, 63, 81, 83, 87, 126, 127, 152, 170, 172, 174, 176, 188, and 198.

Besides, a colorant such as violet, orange, brown, black, or white may be added. Specific examples thereof include Pigment Black 1, 6, 7, 8, 9, 10, 11, 12, 13, 18, 20, 25, 26, 28, 29, 30, 31, and 32; Pigment Violet 19, 23, 29, 32, 36, 38, and 42; Solvent Violet 13 and 36; C.I. Pigment Orange 1, 5, 13, 14, 16, 17, 24, 34, 36, 38, 40, 43, 46, 49, 51, 61, 63, 64, 71, and 73; Pigment Brown 23 and 25; and titanium oxide.

The amount of the colorant added is not in particular restricted; and a sufficient ratio is, based on 100 parts by mass of the carboxyl group-containing photosensitive resin, preferably 10 parts by mass or less and in particular preferably 0.1 to 7 parts by mass.

Further, the elastomer can be combined in the photosensitive resin composition for the purpose of imparting flexibility to the obtained cured product, improving the brittleness of the cured product, or the like. Examples of the elastomer include a polyester-based elastomer, a polyurethane-based elastomer, a polyesterurethane-based elastomer, a polyamide-based elastomer, a polyesteramide-based elastomer, an acrylic elastomer, and an olefin-based elastomer. In addition, a resin obtained by modifying part or all of the epoxy groups of epoxy resin having various backbones with a butadiene-acrylonitrile rubber modified with carboxylic acid at both termini, and the like can be used. Further, an epoxy-containing polybutadiene-based elastomer, an acryl-containing polybutadiene-based elastomer, a hydroxyl group-containing polybutadiene-based elastomer, a hydroxyl group-containing isoprene-based elastomer, and the like can be used. As for the elastomer, one kind thereof may be used solely; or two or more kinds thereof may be used as a mixture.

In addition, a commonly-used known binder polymer can be used for the purpose of improving the flexibility and the property of drying to set to touch of the obtained cured product. As the binder polymer, preferred are cellulose-based, polyester-based, and phenoxy resin-based polymer are preferred. Examples of the cellulose-based polymer include cellulose acetate butyrate (CAB) and cellulose acetate propionate (CAP) series manufactured by Eastman. As the polyester-based polymer, preferred is vylon series manufactured by Toyobo Co., Ltd. As the phenoxy resin-based polymer, preferred are bisphenol A, bisphenol F, and a phenoxy resin of hydrogenated compound thereof.

The amount of the binder polymer added is, based on 100 parts by mass of the carboxyl group-containing photosensitive resin, preferably 50 parts by mass or less, more preferably 1 to 30 parts by mass, in particularly preferably 5 to 30 parts by mass. In cases where the amount of the binder polymer added exceeds 50 parts by mass, the alkaline development property of the photosensitive resin composition may deteriorate; and pot life available for development may be shortened.

Further, a component such as an adhesion promoter, an antioxidant, an ultraviolet absorbent can be further combined as necessary in the photosensitive resin composition. As for these, products known in the field of electronic materials can be used. In addition, at least one kind of commonly-used known thickeners such as fine powder silica, hydrotalcite, organic bentonite, and montmorillonite; antifoaming agents and leveling agents based on silicone, fluorine, polymer, and the like; and at least one kind of commonly-used known additives such as silane coupling agents, anti-rust agents, fluorescent brightening agents based on imidazole, thiazole, triazole, and the like can be combined.

The photosensitive resin layer can be formed by applying the above photosensitive resin composition on the surface opposed to the supporting film and drying it. With consideration of the coating property of the photosensitive resin composition, the photosensitive resin composition can be diluted with an organic solvent to adjust to an appropriate viscosity; applied on the surface opposed to the supporting film using a comma coater, a blade coater, an LIP coater, a rod coater, a squeeze coater, a reverse coater, a transfer roll coater, a gravure coater, a spray coater, or the like such that a uniform thickness is attained; and dried usually at a temperature of 50 to 130° C. for 1 to 30 minutes to volatilize the organic solvent, thereby obtaining a tack-free coating film. The thickness of the coating film is not in particular restricted; and is in general selected as appropriate in a range of 5 to 150 µm and preferably 10 to 60 µm in the thickness after the drying.

The organic solvent that can be used is not in particular restricted; and examples thereof include ketones, aromatic hydrocarbons, glycol ethers, glycol ether acetates, esters, alcohols, aliphatic hydrocarbon, and petroleum solvents. More specific examples include, ketones such as methyl ethyl ketone and cyclohexanone; aromatic hydrocarbons such as toluene, xylene, and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, dipropylene glycol methyl ether acetate, propylene glycol methyl ether acetate, propylene glycol ethyl ether acetate, and propylene glycol butyl ether acetate; alcohols such as ethanol, propanol, ethylene glycol, and propylene glycol; aliphatic hydrocarbon such as octane and decane; and petroleum solvent such as petroleum ether, petroleum naphtha, hydrogenated petroleum naphtha, and solvent naphtha. As for such an organic solvent, one kind thereof may be used solely; or two or more kinds thereof may be used as a mixture.

The organic solvent can be volatilized and dried using a hot air circulation drying furnace, an IR furnace, a hot plate, a convection oven, or the like (a method comprising countercurrent-contacting of a heated air in a dryer using one that includes a heat source in the mode of heating air by steam, and a method comprising spraying a support from a nozzle).

[Protective Film]

For the purpose of preventing dust and the like from adhere to the surface of the above photosensitive resin layer and concurrently improving the operability, the protective film may be provided on the side of the photosensitive dry film according to the present invention opposed to the supporting film of the photosensitive resin layer.

As the protective film, a polyester film, a polyethylene film, a polytetrafluoroethylene film, a polypropylene film, paper subjected to a surface treatment, and the like can for example be used. A material is preferably selected such that adhesion between the protective film and the photosensitive resin layer is smaller than adhesion between the supporting film and the photosensitive resin layer. In addition, at the time of using the photosensitive dry film, the surface that contact with the photosensitive resin layer of the protective film may be subjected to the aforementioned release treatment for the purpose of making the detachment of the protective film easier.

The thickness of the protective film is not in particular restricted and is selected as appropriate in a range of approximately 10 to 150 μm according to the application.

<Method of Producing Printed Wiring Board>

A method of producing a printed wiring board will be described below, which printed wiring board includes a cured coating film on a board on which a circuit pattern is formed using the above photosensitive dry film. FIG. 3 is a schematic cross sectional view for describing the steps of the method of producing a printed wiring board. By way of one example, a method of producing a printed wiring board using the photosensitive dry film that includes the protective film as shown in FIG. 2 will be described. First, i) a protective film is detached from the above photosensitive dry film to expose a photosensitive resin layer, ii) the above-mentioned photosensitive resin layer of the photosensitive dry film is laminated on the board on which the above-mentioned circuit pattern is formed, iii) exposure is carried out from above the above-mentioned supporting film of the photosensitive dry film, iv) the supporting film is detached from the above-mentioned photosensitive dry film and development is carried out to form a resin layer patterned on the above-mentioned board, and v) the above-mentioned patterned resin layer is cured by light irradiation or heat to form a cured coating film, thereby forming the printed wiring board. It is to be noted that in cases where the photosensitive dry film that does not have a protective film as shown in FIG. 1 is used, it goes without saying that the step of detaching the protective film (the step i) is not needed. Each of the steps will be described below.

Figure 3A:
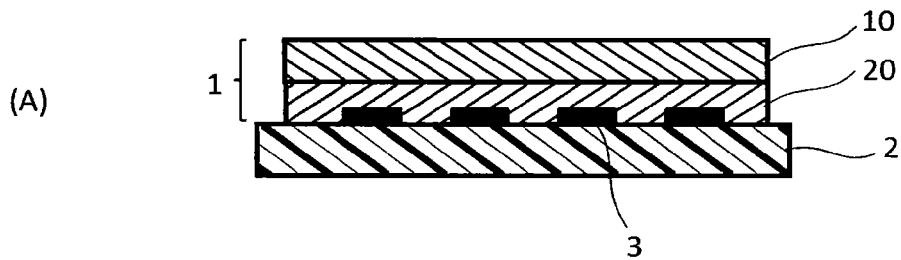
FIGS. 3(A) to (D) is schematic cross sectional views for describing the steps of the method of producing the printed wiring board according to the present invention.

First, the protective film is detached from the photosensitive dry film 1 to expose the photosensitive resin layer; and the photosensitive resin layer of the photosensitive dry film is laminated on the board 2 on which the circuit pattern 3 is formed (FIG. 3A). Examples of the board on which the circuit pattern is formed can include, in addition to printed wiring boards on which a circuit is in advance formed and flexible printed wiring boards, all grades (FR-4 and the like) of copper clad laminates that use materials of copper clad laminates for high frequency circuit using paper phenol, paper epoxy, glass cloth epoxy, glass polyimide, glass cloth/non-woven fabric epoxy, glass cloth/paper epoxy, synthetic fiber epoxy, fluorine resin•polyethylene•polyphenylene ether, polyphenylene oxide•cyanate ester, or the like, other polyimide films, PET films, glass boards, ceramic boards, and wafer boards.

To laminate the photosensitive resin layer of the photosensitive dry film on the circuit board, lamination is preferably carried out using a vacuum laminator or the like under applied pressure and heating. By using such a vacuum laminator, even if the surface of the circuit board has roughness, no air bubbles are mixed and improved filling up dents of the board surface is seen because the photosensitive resin layer is closely attached to the circuit board. The applied pressure condition is preferably about 0.1 to 2.0 MPa; and the heating condition is preferably 40 to 120° C.

Figure 3B:
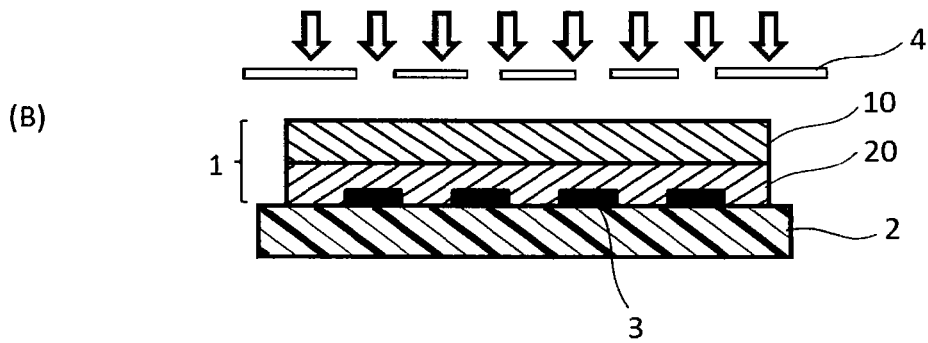

Next, exposure (irradiation of an active energy ray) is carried out from above the supporting film 10 of the photosensitive dry film 1 (FIG. 3B). By this step, the exposed photosensitive resin layer is exclusively cured. The exposure step is not in particular restricted. The exposure may selectively be carried out by, for example, a contact method (or a noncontact method), through the photomask 4 in which a desired pattern is formed using an active energy ray; or a desired pattern may be formed by exposure using a direct patterning apparatus by an active energy ray.

An exposure apparatus used for the active energy ray irradiation only need to be an apparatus that includes a high pressure mercury vapor lamp, an ultrahigh pressure mercury vapor lamp, a metal halide lamp, a mercury short arc lamp, or the like, and radiates an ultraviolet ray of 350 to 450 nm. Further, a direct patterning apparatus (for example, a laser direct imaging apparatus that directly draws picture images using a laser based on CAD data from a computer) can also be used. A source of laser light of the direct patterning equipment may be either a gas laser or a solid laser as long as it employs a laser light with a maximum wavelength in a range of 350 to 410 nm. The exposure amount for the picture image formation varies in film thickness and the like, and can in general be set to a range of 20 to 800 mJ/cm$^2$ and preferably 20 to 600 mJ/cm$^2$.

Figure 3C:
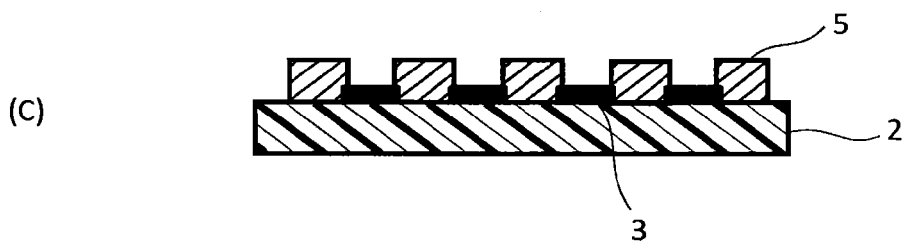

After the exposure, the supporting film 10 is detached from the photosensitive dry film 1 and development is carried out, thereby forming the resin layer 5 that is patterned on the board 2 (FIG. 3C). Upon the detachment of the supporting film, the morphology of the surface of the supporting film is incorporated in the surface of the resin layer 5 that is subjected to exposure to be cured (figure not shown).

The development step is not in particular restricted; and a dipping method, a shower method, a spray method, a brush method, or the like can be employed. Further, as a development liquid, an aqueous solution of alkali such as potassium hydroxide, sodium hydroxide, sodium carbonate, potassium carbonate, sodium phosphate, sodium silicate, ammonia, or amines can be used.

Figure 3D:
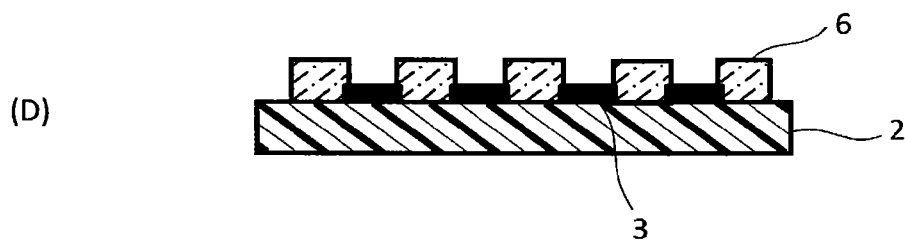

Subsequently, the resin layer 5 patterned is cured by active energy ray (light) irradiation or heating to form the cured coating film 6 (FIG. 3D). This step is called final curing, promotes the polymerization of unreacted monomers in the photosensitive resin layer, and further can proceed thermal curing of carboxyl group-containing photosensitive resin and the epoxy resin to reduce the amount of remaining carboxyl group. The active energy ray irradiation can be carried out in the same manner as described in the above exposure; and preferably carried out in a stronger condition than the irradiation energy at the time of the exposure. For example, the irradiation energy can be set to 500 to 3000 mJ/cm$^2$. In addition, the thermal curing can be carried out in a heating condition of about 100 to 200° C. for 20 to 90 minutes. It is to be noted that the final curing is preferably is carried out after the photo-curing. By carrying out the photo-curing before the thermal curing, the flow of the resin may be inhibited even at the time of the thermal curing and the incorporated surface may be maintained.

The surface of the cured coating film 6 obtained as described above has an arithmetic average surface roughness Ra of 50 to 390 nm. As a result, the filling property when underfill is filled can in particular improve; and concurrently the adhesion of the cured coating film with the mold material can improve as well. Therefore, the photosensitive dry film according to the present invention can be suitably used for, in particular, the formation of solder resist layer for IC package.

EXAMPLES

By way of example, the present invention will be described in detail below. However, the present invention is by no means limited to the examples.

<Preparation of Carboxyl Group-Containing Photosensitive Resin>

To an autoclave that included a thermometer, a nitrogen introduction apparatus and alkylene oxide introduction apparatus, and a stirring apparatus, 119.4 g of novolak-type cresol resin (Shonol CRG951 manufactured by Showa Denko K. K., OH equivalent: 119.4), 1.19 g of potassium hydroxide, and 119.4 g of toluene were charged. The system was subjected, while stirred, to internal nitrogen replacement and heated to increase the temperature. Subsequently, 63.8 g of propylene oxide was gradually added dropwise; and the resulting mixture was allowed to proceed a reaction at 125 to 132° C. and 0 to 4.8 kg/cm$^2$ for 16 hours. Thereafter, the resultant was cooled to room temperature; and this reaction solution was added and mixed with 1.56 g of 89% phosphoric acid to neutralize potassium hydroxide, thereby obtaining a propylene oxide reaction solution of novolak-type cresol resin with a non-volatile content of 62.1% and a hydroxyl value of 182.2 g/eq. In the obtained novolak-type cresol resin, an average of 1.08 mol of alkylene oxide was added per equivalent of phenolic hydroxyl group.

To a reactor that include a stirring apparatus, a thermometer, and an air blowing tube, 293.0 g of the obtained alkylene oxide reaction solution of novolak-type cresol resin, 43.2 g of acrylic acid, 11.53 g of methanesulfonic acid, 0.18 g of methylhydroquinone, and 252.9 g of toluene were charged. Air was blown therein at a rate of 10 ml/min. The resulting mixture was allowed to proceed a reaction at 110° C. for 12 hours while stirred. As for water generated by the reaction, 12.6 g of water was distilled as an azeotropic mixture with toluene. Thereafter, the resultant was cooled to room temperature; and the obtained reaction solution was neutralized with 35.35 g of a 15% aqueous sodium hydroxide solution and then washed with water. Thereafter, toluene was replaced with 118.1 g of diethylene glycol monoethyl ether acetate and distilled away in an evaporator, thereby obtaining a novolak-type acrylate resin solution. Subsequently, To a reactor that include a stirring apparatus, a thermometer, and an air blowing tube, 332.5 g of the obtained novolak-type acrylate resin solution, and 1.22 g of triphenylphosphine. Air was blown therein at a rate of 10 ml/min; and 62.3 g of tetrahydrophthalic anhydride was, while stirred, gradually added thereto. The resultant was allowed to proceed a reaction at 95 to 101° C. for six hours while stirred, thereby obtaining a solution with an acid value of 88 mg KOH/g that contained a carboxyl group-containing photosensitive resin 1 as non-volatile content in the amount of 71%.

<Preparation of Photosensitive Resin Compositions 1 to 5>

Components selected from the above carboxyl group-containing photosensitive resin, a carboxyl group-containing acrylic copolymer having an alicyclic backbone (Cyclomer P (ACA) Z320 manufactured by Daicel Corporation (containing 35% carbitol acetate), a photosensitive monomer of dipentaerythritol hexaacrylate (KAYARAD DPHA manufactured by Nippon Kayaku Co., Ltd.) as an acrylate compound, a novolak-type epoxy resin (RE-306CA90 manufactured by Nippon Kayaku Co., Ltd., containing 10% carbitol acetate) and a biphenol novolak-type epoxy resin (NC-3000H CA75 manufactured by Nippon Kayaku Co., Ltd., containing 25% carbitol acetate) as epoxy resins which were thermosetting components, Irgacure OXE02 manufactured by BASF Japan Ltd. as an photoinitiator, barium sulfate (B-30 manufactured by Sakai Chemical Industry Co., Ltd.) and a spherical silica (Admafine SO-E2 manufactured by Admatechs Company Limited) as fillers, melamine as a heat curing catalyst, carbon black M-50 manufactured by Mitsubishi Chemical Corporation, dioxazine violet Violet B, C.I. Pigment Yellow 147, C.I. Pigment Blue 15:3, and Red A2BN manufactured by BASF Japan Ltd. as colorants were combined at a ratio (parts by mass) shown in Table 1 below and mixed in advance using a stirring apparatus, and then kneaded using a three-roll mill, thereby preparing photosensitive resin compositions 1 and 2, and 4 and 5.

Further, the photosensitive resin composition 3 was prepared in the same manner as described in the photosensitive resin composition 2 except that a bifunctional urethane acrylate (UN-7600 manufactured by Negami Chemical Industrial Co., Ltd.) was used in place of a photosensitive monomer of dipentaerythritol hexaacrylate (KAYARAD DPHA manufactured by Nippon Kayaku Co., Ltd.).

TABLE 1

| Component (part by mass) | | Photosensitive resin composition | | | | |
|---|---|---|---|---|---|---|
| | | 1 | 2 | 3 | 4 | 5 |
| Carboxyl group-containing photosensitive resin | Carboxyl group-containing photosensitive resin 1 | 154 | 154 | 154 | 130 | 130 |
| | Cyclomer P (ACA) Z320 | — | — | — | 25 | 25 |
| Photosensitive monomer | KAYARAD DPHA | 15 | 30 | — | 25 | 20 |
| | UN-7600 | — | — | 30 | — | — |
| Thermosetting component | RE-306 CA90 | 20 | 35 | 35 | 35 | 30 |
| | NC-3000H CA75 | 300 | 15 | 15 | 20 | 35 |
| Photoinitiator | Irgacure OXE02 | 1 | — | — | — | 0.5 |
| | Irgacure 369 | — | 3 | 3 | 3 | — |
| | TPO | — | — | — | — | 10 |
| Filler | B-30 | 50 | 100 | 100 | — | — |
| | Admafine SO-E2 | 35 | — | — | 100 | 100 |
| Heat curing catalyst | Melamine | 5 | 5 | 5 | 5 | 5 |
| Fluorescent brightening agent | Nikkafluor SB | — | — | — | — | 10 |
| Colorant | Carbon blackM-50 | — | 0.3 | 0.3 | 0.3 | — |
| | Dioxane violet Violet B | — | 1 | 1 | 1 | — |
| | C.I. Pigment Yellow 147 | 1 | 1 | 1 | 1 | — |
| | C.I. Pigment Blue 15:3 | 1 | 1 | 1 | 1 | — |
| | Red A2BN | — | 1 | 1 | 1 | — |
| | Tipaque CR-97 | — | — | — | — | 20 |

Example 1

<Preparation of Photosensitive Dry Film>

To the photosensitive resin composition 1 obtained as described above, 300 g of methyl ethyl ketone was added to dilute and the resultant was stirred for 15 minutes using a stirring apparatus, thereby obtaining a coating liquid. The coating liquid was applied to a polyethylene terephthalate film (Emblet PTH-25 manufactured by Unitika Limited) with an arithmetic surface roughness Ra of 150 nm and a thickness of 38 μm and usually dried at a temperature of 80° C. for 15 minutes to form a photosensitive resin layer with a thickness of 20 μm. A polypropylene film (OPP-FOA manufactured by Futamura Chemical Co., Ltd.) with a thickness of 18 μm was then laminated on the photosensitive resin layer to prepare a photosensitive dry film.

<Preparation of Printed Wiring Board>

The surface of the board on which the circuit is formed (500 mm×600 mm×0.4 mmt) was subjected to chemical polishing. The polyethylene film was detached from the thus obtained photosensitive dry film; and the photosensitive resin layer of the photosensitive dry film was laminated on the side subjected to the surface polishing. Subsequently, thermal laminating was carried out using a vacuum laminator (MVLP-500 manufactured by Meiki Co., Ltd.) in conditions of a degree of applied pressure: 0.8 Mpa, 70° C., one minute, a degree of vacuum: 133.3 Pa to closely adhere the board with the photosensitive resin layer.

Subsequently, exposure was carried out from above the photosensitive dry film via a photomask having a negative pattern with a diameter of 30 μm to 100 μm using an exposure apparatus equipped with a high pressure mercury vapor lamp (short arc lamp). Thereafter, the polyethylene terephthalate film was detached from the photosensitive dry film to expose the photosensitive resin layer. Thereafter, development was carried out for 60 seconds in conditions of 30° C. and a spray pressure of 2 kg/cm$^2$ using a 1% by weight $Na_2CO_3$ aqueous solution to form a resin layer having a prescribed resist pattern. Subsequently, irradiation to the resin layer was carried out at a light exposure of 1 J/cm$^2$ in a UV conveyor furnace that included a high pressure mercury vapor lamp. Thereafter, the resin layer was completely cured by heating at 160° C. for 60 minutes to form a cured coating film, thereby preparing a printed wiring board with the cured coating film provided on the board.

Example 2

A printed wiring board was prepared in the same manner as described in Example 1 except that a polyethylene terephthalate film with an arithmetic surface roughness Ra of 270 nm and a thickness of 38 μm (Emblet PTHA-25 manufactured by Unitika Limited) was used in place of the polyethylene terephthalate film with an arithmetic surface roughness Ra of 150 nm and a thickness of 38 μm in Example 1.

Example 3

A printed wiring board was prepared in the same manner as described in Example 1 except that a polyethylene terephthalate film with an arithmetic surface roughness Ra of 380 nm and a thickness of 38 μm (Lumirror X42 manufactured by Toray Industries, Inc.) was used in place of the polyethylene terephthalate film with an arithmetic surface roughness Ra of 150 nm and a thickness of 38 μm in Example 1.

Comparative Example 1

A printed wiring board was prepared in the same manner as described in Example 1 except that a polyethylene terephthalate film with an arithmetic surface roughness Ra of 400 nm and a thickness of 38 μm (SM-D manufactured by Unitika Limited) was used in place of the polyethylene terephthalate film with an arithmetic surface roughness Ra of 150 nm and a thickness of 38 μm in Example 1.

Comparative Example 2

A printed wiring board was prepared in the same manner as described in Example 1 except that a polyethylene terephthalate film with an arithmetic surface roughness Ra of 23 nm and a thickness of 38 μm (R-310 manufactured by Mitsubishi Plastics, Inc.) was used in place of the polyethylene terephthalate film with an arithmetic surface roughness Ra of 150 nm and a thickness of 38 μm in Example 1.

Example 4

A printed wiring board was prepared in the same manner as described in Example 1 except that the photosensitive resin composition 2 was used in place of the photosensitive resin composition 1 in Example 1.

Example 5

A printed wiring board was prepared in the same manner as described in Example 2 except that the photosensitive resin composition 2 was used in place of the photosensitive resin composition 1 in Example 2.

Example 6

A printed wiring board was prepared in the same manner as described in Example 3 except that the photosensitive resin composition 2 was used in place of the photosensitive resin composition 1 in Example 3.

Comparative Example 3

A printed wiring board was prepared in the same manner as described in Comparative Example 1 except that the photosensitive resin composition 2 was used in place of the photosensitive resin composition 1 in Comparative Example 1.

Comparative Example 4

A printed wiring board was prepared in the same manner as described in Comparative Example 2 except that the photosensitive resin composition 2 was used in place of the photosensitive resin composition 1 in Comparative Example 2.

Example 7

A printed wiring board was prepared in the same manner as described in Example 1 except that the photosensitive resin composition 3 was used in place of the photosensitive resin composition 1 in Example 1.

Example 8

A printed wiring board was prepared in the same manner as described in Example 2 except that the photosensitive resin composition 3 was used in place of the photosensitive resin composition 1 in Example 2.

Example 9

A printed wiring board was prepared in the same manner as described in Example 3 except that the photosensitive resin composition 3 was used in place of the photosensitive resin composition 1 in Example 3.

Comparative Example 5

A printed wiring board was prepared in the same manner as described in Comparative Example 1 except that the photosensitive resin composition 3 was used in place of the photosensitive resin composition 1 in Comparative Example 1.

Comparative Example 6

A printed wiring board was prepared in the same manner as described in Comparative Example 2 except that the photosensitive resin composition 3 was used in place of the photosensitive resin composition 1 in Comparative Example 2.

Example 10

A printed wiring board was prepared in the same manner as described in Example 1 except that the photosensitive resin composition 4 was used in place of the photosensitive resin composition 1 in Example 1.

Example 11

A printed wiring board was prepared in the same manner as described in Example 2 except that the photosensitive resin composition 4 was used in place of the photosensitive resin composition 1 in Example 2.

Example 12

A printed wiring board was prepared in the same manner as described in Example 3 except that the photosensitive resin composition 4 was used in place of the photosensitive resin composition 1 in Example 3.

Comparative Example 7

A printed wiring board was prepared in the same manner as described in Comparative Example 1 except that the photosensitive resin composition 4 was used in place of the photosensitive resin composition 1 in Comparative Example 1.

Comparative Example 8

A printed wiring board was prepared in the same manner as described in Comparative Example 2 except that the photosensitive resin composition 4 was used in place of the photosensitive resin composition 1 in Comparative Example 2.

Example 13

A printed wiring board was prepared in the same manner as described in Example 1 except that the photosensitive resin composition 5 was used in place of the photosensitive resin composition 1 in Example 1.

Example 14

A printed wiring board was prepared in the same manner as described in Example 2 except that the photosensitive resin composition 5 was used in place of the photosensitive resin composition 1 in Example 2.

Example 15

A printed wiring board was prepared in the same manner as described in Example 3 except that the photosensitive resin composition 5 was used in place of the photosensitive resin composition 1 in Example 3.

Comparative Example 9

A printed wiring board was prepared in the same manner as described in Comparative Example 1 except that the photosensitive resin composition 5 was used in place of the photosensitive resin composition 1 in Comparative Example 1.

Comparative Example 10

A printed wiring board was prepared in the same manner as described in Comparative Example 2 except that the photosensitive resin composition 5 was used in place of the photosensitive resin composition 1 in Comparative Example 2.

<Evaluation of Surface Gloss of Cured Coating Film>

With regard to the cured coating film surface of each of the printed wiring boards of Examples 1 to 15 and Comparative Examples 1 to 10 which were prepared as described above, the 60° specular reflectance was measured using a micro-tri-gloss (manufactured by BYK chemie Japan KK). The average of the measured numerical values was determined and was rounded off to the nearest integer. The evaluation of gloss was carried out in accordance with the following evaluation criteria.

O: One with an average 60° specular reflectance of more than 10 and less than 40

X: One with an average 60° specular reflectance of not more than 10 or not less than 40

The evaluation results are as shown in Table 2 below.

<Evaluation of Wettability of Cured Coating Film>

With regard to the cured coating film surface of each of the printed wiring boards of Examples 1 to 15 and Comparative Examples 1 to 10 which were prepared as described above, the water contact angle was measured using a contact angle meter (DM300) manufactured KYOWA INTERFACE SCIENCE Co., Ltd. The measured contact angles are as shown in Table 2 below.

<Evaluation of Adhesion of Cured Coating Film>

On the cured coating film surface of each of the printed wiring boards of Examples 1 to 15 and Comparative Examples 1 to 10 which were prepared as described above, cylindrical (2.523 mm in diameter and 3.00 mm in height) mold press formation was carried out using a mold material (SUMIKON EME-G770 manufactured by Sumitomo Bakelite Co., Ltd.); and the mold material was cured by heating at 175° C. for four hours. Thereafter, shear was applied to the mold material provided on the cured coating film surface; and peel strength between the cured coating film and the mold material was measured. The measurement results are as shown in Table 2 below.

<Evaluation of Resolution of Cured Coating Film>

In the cured coating film of each of the printed wiring boards of Examples 1 to 15 and Comparative Examples 1 to 10 which were prepared as described above, the diameter of an opening subjected to exposure and development via a negative pattern with a diameter of 80 μm was measured using an optical microscope. The evaluation criteria for resolution were as follows:

O: One with the actual measurement value of the diameter being more than 76 μm and less than 84 μm (An error was less than 5% based on the negative pattern.)

X: One with the actual measurement value of the diameter being not more than 76 μm or not less than 84 μm (An error was 5% or more based on the negative pattern.)

The evaluation results of the resolution are as shown in Table 2 below.

<Evaluation of Electric Characteristics>

With regard to the boards of Examples 1 to 15 and Comparative Examples 1 to 10 which were prepared as described above, an evaluation board was prepared in the above condition using an interdigitated array electrode pattern with line/space=50/50 μm; and the evaluation of electric characteristics was carried out. As for the evaluation method, this interdigitated array electrode was applied with a bias voltage of DC30 V under a heating and humidification condition of 121° C. and 97% R.H. and a period of time until insulation deterioration was observed was measured. Here, as for the evaluation criteria for the electric characteristics, when an electrical resistance value fell below $1 \times 10^{-6} \Omega$, the insulation deterioration was judged to occur.

The evaluation results of the electric characteristics are as shown in Table 2 below.

<Evaluation of Filling Property of Underfill>

The surface of the boards of Examples 1 to 15 and Comparative Examples 1 to 10 which were prepared as described above was subjected to plasma treatment (argon gas, 500 W, 60 seconds) and was then mounted on a silicon die. After the mounting, underfill was poured into the gap between the silicon die and the board to be cured at 170° C. Finally, the silicon die was cut out using a grinder; and the filling property of underfill was evaluated. In addition, the same evaluation as described above was carried out without carrying out the plasma treatment to the board surface. The evaluation criteria were as follows:

O: The underfill is uniformly filled in the lower front of the silicon die.

X: The underfill partially contains air bubbles.

The evaluation results of the filling property of underfill are as shown in Table 2 below.

TABLE 2

| | Surface roughness of supporting film, Ra (nm) | Gloss Average reflectance | Gloss Evaluation | Contact angle (°) | Adhesion (N) | Resolution | Electric characteristics (h) | Underfill Filling property With plasma treatment | Underfill Filling property Without plasma treatment |
|---|---|---|---|---|---|---|---|---|---|
| Example 1 | 150 | 37 | O | 23 | 171 | O | 255 | O | O |
| Example 2 | 270 | 25 | O | 22 | 172 | O | 265 | O | O |
| Example 3 | 380 | 19 | O | 18 | 181 | O | 250 | O | O |
| Example 4 | 150 | 37 | O | 23 | 170 | O | 260 | O | O |
| Example 5 | 270 | 25 | O | 21 | 175 | O | 260 | O | O |
| Example 6 | 380 | 18 | O | 18 | 180 | O | 265 | O | O |

TABLE 2-continued

| | Surface roughness of supporting film, Ra (nm) | Gloss Average reflectance | Gloss Evaluation | Contact angle (°) | Adhesion (N) | Resolution | Electric characteristics (h) | Underfill Filling property With plasma treatment | Underfill Filling property Without plasma treatment |
|---|---|---|---|---|---|---|---|---|---|
| Example 7 | 150 | 36 | ○ | 22 | 171 | ○ | 155 | ○ | ○ |
| Example 8 | 270 | 25 | ○ | 20 | 176 | ○ | 150 | ○ | ○ |
| Example 9 | 380 | 17 | ○ | 17 | 180 | ○ | 155 | ○ | ○ |
| Example 10 | 150 | 35 | ○ | 19 | 182 | ○ | 255 | ○ | ○ |
| Example 11 | 270 | 20 | ○ | 17 | 185 | ○ | 260 | ○ | ○ |
| Example 12 | 380 | 12 | ○ | 15 | 188 | ○ | 265 | ○ | ○ |
| Example 13 | 159 | 36 | ○ | 20 | 181 | ○ | 260 | ○ | ○ |
| Example 14 | 270 | 19 | ○ | 18 | 187 | ○ | 255 | ○ | ○ |
| Example 15 | 380 | 14 | ○ | 16 | 190 | ○ | 260 | ○ | ○ |
| Comparative Example 1 | 400 | 4 | X | 12 | 178 | X | 265 | ○ | ○ |
| Comparative Example 2 | 23 | 75 | X | 81 | 75 | ○ | 260 | ○ | X |
| Comparative Example 3 | 400 | 4 | X | 12 | 179 | X | 260 | ○ | ○ |
| Comparative Example 4 | 23 | 74 | X | 83 | 76 | ○ | 270 | ○ | X |
| Comparative Example 5 | 400 | 4 | X | 13 | 177 | X | 145 | ○ | ○ |
| Comparative Example 6 | 23 | 75 | X | 83 | 75 | ○ | 150 | ○ | X |
| Comparative Example 7 | 400 | 3 | X | 11 | 185 | X | 265 | ○ | ○ |
| Comparative Example 8 | 23 | 70 | X | 79 | 81 | ○ | 260 | ○ | X |
| Comparative Example 9 | 400 | 3 | X | 12 | 183 | X | 260 | ○ | ○ |
| Comparative Example 10 | 23 | 71 | X | 80 | 82 | ○ | 265 | ○ | X |

As is clear from the above results, in the case where the photosensitive dry film of the present invention, a sufficient filling property of underfill is attained even without carrying out a plasma treatment to the printed wiring board surface; and the fluidity of underfill and the adhesion with the mold material improve while a high resolution is maintained; and therefore the photosensitive dry film of the present invention is useful for printed wiring boards, in particular package boards.

The invention claimed is:

1. A photosensitive dry film for forming a solder resist layer, comprising:
   a supporting film;
   a photosensitive resin layer provided on one side of the supporting film; and
   a protective film formed on one side of the photosensitive resin layer such that the protective film is on an opposite side with respect to the supporting film,
   wherein the one side of the supporting film on which the photosensitive resin layer is provided has an arithmetic average surface roughness Ra in a range of 100 nm to 390 nm, the photosensitive resin comprises at least one thermosetting component selected from the group consisting of isocyanate compound, a blocked isocyanate compound, an amino resin, a maleimide compound, a benzoxazine resin, a carbodiimide resin, a cyclocarbonate compound, a polyfunctional epoxy compound, a polyfunctional oxetane compound, and an episulfide resin, and the protective film comprises at least one selected from the group consisting of a polyester film, a polyethylene film, a polytetrafluoroethylene film, a polypropylene film, and paper subjected to a surface treatment.

2. The photosensitive dry film according to claim 1, wherein adhesion between the protective film and the photosensitive resin layer is smaller than adhesion between the supporting film and the photosensitive resin layer.

3. The photosensitive dry film according to claim 1, wherein the photosensitive resin layer has a thickness in a range of 5 μm to 150 μm.

4. The photosensitive dry film according to claim 1, wherein the supporting film comprises a resin composition comprising a thermoplastic resin and a filler.

5. A process for producing a printed wiring board, comprising:
   laminating the photosensitive resin layer of the photosensitive dry film of claim 1 on a board;
   exposing the supporting film of the photosensitive dry film from above;
   detaching the supporting film from the photosensitive dry film and subsequently developing such that a resin layer patterned on the board is formed; and
   curing the patterned resin layer by light irradiation or heat such that a cured coating film is formed,
   wherein the cured coating film has a surface having an arithmetic average surface roughness Ra in a range of 100 nm to 390 nm.

6. The photosensitive dry film according to claim 2, wherein the photosensitive resin layer has a thickness in a range of 5 μm to 150 μm.

7. The photosensitive dry film according to claim 2, wherein the supporting film comprises a resin composition comprising a thermoplastic resin and a filler.

8. A process for producing a printed wiring board, comprising:

laminating the photosensitive resin layer of the photosensitive dry film of claim 2 on a board;

exposing the supporting film of the photosensitive dry film from above;

detaching the supporting film from the photosensitive dry film and subsequently developing such that a resin layer patterned on the board is formed; and curing the patterned resin layer by light irradiation or heat such that a cured coating film is formed, wherein the cured coating film has a surface having an arithmetic average surface roughness Ra in a range of 100 nm to 390 nm.

9. The photosensitive dry film according to claim 3, wherein the supporting film comprises a resin composition comprising a thermoplastic resin and a filler.

10. A process for producing a printed wiring board from the photosensitive dry film, comprising:

laminating the photosensitive resin layer of the photosensitive dry film of claim 3 on a board;

exposing the supporting film of the photosensitive dry film from above;

detaching the supporting film from the photosensitive dry film and subsequently developing such that a resin layer patterned on the board is formed; and curing the patterned resin layer by light irradiation or heat such that a cured coating film is formed, wherein the cured coating film has a surface having an arithmetic average surface roughness Ra in a range of 100 nm to 390 nm.

11. A process for producing a printed wiring board from the photosensitive dry film, comprising:

laminating the photosensitive resin layer of the photosensitive dry film of claim 4 on a board;

exposing the supporting film of the photosensitive dry film from above;

detaching the supporting film from the photosensitive dry film and subsequently developing such that a resin layer patterned on the board is formed; and curing the patterned resin layer by light irradiation or heat such that a cured coating film is formed, wherein the cured coating film has a surface having an arithmetic average surface roughness Ra in a range of 100 nm to 390 nm.

12. The photosensitive dry film according to claim 1, wherein the arithmetic average surface roughness Ra of the one side of the supporting film on which the photosensitive resin layer is provided is in a range of 150 nm to 390 nm.

13. The process according to claim 5, wherein the arithmetic average surface roughness Ra of the surface of the cured coating film is in a range of 150 nm to 390 nm.

14. The process according to claim 8, wherein the arithmetic average surface roughness Ra of the surface of the cured coating film is in a range of 150 nm to 390 nm.

15. The process according to claim 10, wherein the arithmetic average surface roughness Ra of the surface of the cured coating film is in a range of 150 nm to 390 nm.

16. The photosensitive dry film according to claim 2, wherein the arithmetic average surface roughness Ra of the surface of the cured coating film is in a range of 150 nm to 390 nm.

17. The photosensitive dry film according to claim 3, wherein the arithmetic average surface roughness Ra of the surface of the cured coating film is in a range of 150 nm to 390 nm.

18. The photosensitive dry film according to claim 4, wherein the arithmetic average surface roughness Ra of the surface of the cured coating film is in a range of 150 nm to 390 nm.

* * * * *